(12) United States Patent
Ito

(10) Patent No.: US 10,116,308 B2
(45) Date of Patent: Oct. 30, 2018

(54) ROTATION OPERATION DEVICE

(71) Applicant: DENSO CORPORATION, Kariya, Aichi-pref. (JP)

(72) Inventor: Masahiro Ito, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 27 days.

(21) Appl. No.: 15/103,550

(22) PCT Filed: Dec. 26, 2014

(86) PCT No.: PCT/JP2014/006479
§ 371 (c)(1),
(2) Date: Jun. 10, 2016

(87) PCT Pub. No.: WO2015/111121
PCT Pub. Date: Jul. 30, 2015

(65) Prior Publication Data
US 2016/0315613 A1    Oct. 27, 2016

(30) Foreign Application Priority Data

Jan. 22, 2014 (JP) ................................ 2014-009870
Sep. 25, 2014 (JP) ................................ 2014-195482

(51) Int. Cl.
*H01H 13/14* (2006.01)
*H03K 17/975* (2006.01)
(Continued)

(52) U.S. Cl.
CPC ......... *H03K 17/975* (2013.01); *H01H 19/003* (2013.01); *H01H 19/11* (2013.01);
(Continued)

(58) Field of Classification Search
CPC ...... H03K 17/962; H01H 19/11; H01H 19/63; H01H 2239/006; H01H 19/003;
(Continued)

(56) References Cited

U.S. PATENT DOCUMENTS

| 2007/0140454 A1 | 6/2007 | Ito |
| 2007/0170046 A1 | 7/2007 | Ito |
| 2010/0200384 A1* | 8/2010 | Tsuduki ............... H01H 25/065 200/336 |

FOREIGN PATENT DOCUMENTS

| JP | 2004241248 A | 8/2004 |
| JP | 2007234482 A | 9/2007 |

(Continued)

*Primary Examiner* — Ahmed Saeed
(74) *Attorney, Agent, or Firm* — Harness, Dickey & Pierce, P.L.C.

(57) ABSTRACT

A rotation operation device includes: a rotation operation section having a cylindrical shape; multiple recessed and projecting sections arranged on an axial end surface or a peripheral surface of the rotation operation section; a conductive section having a protruding section protruding toward each recessed and projecting section and an elastic section biasing the protruding section to each recessed and projecting section, and movable in a recess-and-projection direction when the rotation operation section rotates; an electrode section changing a capacitance in accordance with a movement of the conductive section; and a detecting section detecting the change in the capacitance. The conductive section is moved in turn in the recess-and-projection direction at a different timing. The detecting section detects a rotation direction and a rotation quantity of the rotation operation section by means of a combination pattern of the change in the capacitance.

10 Claims, 20 Drawing Sheets

(51) Int. Cl.
*H01H 19/00* (2006.01)
*H01H 19/11* (2006.01)
*H01H 19/63* (2006.01)
*H01H 19/62* (2006.01)

(52) U.S. Cl.
CPC ............. *H01H 19/62* (2013.01); *H01H 19/63* (2013.01); *H01H 2239/006* (2013.01); *H03K 2217/94068* (2013.01); *H03K 2217/94073* (2013.01)

(58) Field of Classification Search
CPC ...... H01H 19/005; H01H 19/14; H01H 19/62; H01H 2025/048; H01H 21/22; H01H 2215/00; H01H 2221/01; H01H 2221/066; H01H 2231/016; H01H 25/065
USPC .... 200/600, 11 R, 336, 4, 18, 316, 564, 570
See application file for complete search history.

(56) References Cited

FOREIGN PATENT DOCUMENTS

| | | |
|---|---|---|
| JP | 4279121 B2 | 6/2009 |
| JP | 4547676 B2 | 9/2010 |
| JP | 4652186 B2 | 3/2011 |
| JP | 4687443 B2 | 5/2011 |
| JP | 2013037782 A | 2/2013 |

\* cited by examiner

DETECTION LOGIC

|  | Hi DETECTION (PRESENT TIME) | | |
|---|---|---|---|
|  | A | B | C |
| Hi DETECTION (LAST TIME) A | 0 | +1 | −1 |
| Hi DETECTION (LAST TIME) B | −1 | 0 | +1 |
| Hi DETECTION (LAST TIME) C | +1 | −1 | 0 |

(a)

(b)

(a)

(b)

(a)

(b)

(a)

(b)

(a)

(b)

STOP POSITION

ROTATION OPERATION DEVICE

CROSS REFERENCE TO RELATED APPLICATIONS

This application is a U.S. National Phase Application under 35 U.S.C. 371 of International Application No. PCT/JP2014/006479 filed on Dec. 26, 2014 and published in Japanese as WO 2015/111121 A1 on Jul. 30, 2015. This application is based on and claims the benefit of priority from Japanese Patent Applications No. 2014-009870 filed on Jan. 22, 2014, and No. 2014-195482 filed on Sep. 25, 2014. The entire disclosures of all of the above applications are incorporated herein by reference.

TECHNICAL FIELD

The present disclosure relates to a rotation operation device which rotationally operates a rotation operation section, to input information into predetermined equipment.

BACKGROUND ART

As a conventional rotation operation device, a device described in Patent Literature 1 is known, for example. A rotation operation device of Patent Literature 1 has been applied to a vehicle heater control device. A cylindrical holder is fixed to an insulating substrate, a cylindrical rotor is provided on an outer peripheral section of the holder, and further, a rotary knob is provided on the outer peripheral section of the rotor. The rotary knob is fixed to the rotor. The rotary knob and the rotor are rotatable with respect to the holder, and form a rotation operation section.

A region corresponding to the inside of the cylinder of the holder on the insulating substrate is provided with a plurality of (ten) fixed electrodes arrayed in a circumferential direction. Further, a flange section is formed at the end of the rotor on the opposite side to the insulating substrate, and a region of this flange section which is opposite to the fixed electrode is provided with a plurality of (four) movable electrodes arrayed in the circumferential direction. The surfaces of the rotor and the rotary knob are plated, and when a finger of an operator touches the rotary knob, the finger and the movable electrode come into an electrically connected state via the plating.

When the operator rotates the rotation operation section, the movable electrode passes through the plurality of fixed electrodes. At this time, the fixed electrode closest to the movable electrode comes into the electrically connected state, and a detection circuit detects the electrically connected states of the plurality of fixed electrodes. Then, from results of the above detection, a control section determines a rotation quantity and a rotation direction (clockwise or counterclockwise) of the rotation operation section, and actuates a control mechanism for controlling a temperature in the vehicle, to change a preset temperature.

However, in the rotation input device of Patent Literature 1 above, for grasping the rotation quantity and the rotation direction of the rotation operation section, the fixed electrodes are provided on the insulating substrate, and the movable electrodes are further provided in the rotation operation section, thus requiring a large number of electrodes. Then, the rotation operation section is required to have spaces for providing the movable electrodes. Further, with the movable electrodes provided in the rotation operation section, the surface of the rotation operation section (rotor and rotary knob) is plated so that the finger of the operator and the movable electrode come into electrically contact, which generally makes the cost high.

PRIOR ART LITERATURES

Patent Literature

Patent Literature 1: Japanese Patent No. 4652186

SUMMARY OF INVENTION

It is an object of the present disclosure to provide a rotation operation device capable of detecting a rotation quantity and a rotation direction of a rotation operation section without the need to set a movable electrode on the rotation operation section side.

According to a first aspect of the present disclosure, a rotation operation device includes: a rotation operation section having a cylindrical shape and rotationally operable by an operator around an axis of the cylindrical shape; a plurality of recessed and projecting sections arranged on an axial end surface or a peripheral surface of the rotation operation section and having recesses and projections in a circumferential direction of the rotation operation section; a conductive section made of a conductive material, having a protruding section protruding toward each of the recessed and projecting sections and an elastic section that biases the protruding section by elasticity to each of the recessed and projecting sections, and movable in a recess-and-projection direction by each of the recessed and projecting sections when the rotation operation section rotates; an electrode section disposed so as to face the conductive section and changing a capacitance in accordance with a movement of the conductive section; and a detecting section detecting the change in the capacitance. Three or more sets of combination of the recessed and projecting sections, the conductive section, and the electrode section are provided. The conductive section in each set is moved in turn by a respective recessed and projecting section in the recess-and-projection direction at a different timing with regular intervals. The detecting section detects a rotation direction and a rotation quantity of the rotation operation section by means of a combination pattern of the change in the capacitance provided by the electrode section.

According to the above rotation operation device, three or more sets of combination of the recessed and projecting sections, the conductive section, and the electrode section are provided, and the conductive sections are moved by the respective recessed and projecting sections in the recess-and-projection direction at different timings. When the rotation operation section is rotationally operated, capacitances which are generated by the electrode sections change with the move of the conductive sections toward the recessed and projecting sections. Then, the detecting section can detect a rotation direction and a rotation quantity of the rotation operation section by means of a combination pattern of the changes in capacitances in the electrode sections.

Here, the electrode sections are disposed so as to face the respective conductive sections. Hence it is possible to detect the rotation direction and the rotation quantity of the rotation operation section without providing the electrode section on the rotation operation section side.

According to a second aspect of the present disclosure, a rotation operation device includes: a rotation operation section having a cylindrical shape and rotationally operable by an operator around an axis of the cylindrical shape; a recessed and projecting section arranged on an axial end surface or a peripheral surface of the rotation operation section and having a recess and a projection in a circumferential direction of the rotation operation section; a plurality of conductive sections, each of which is made of a conductive material, has a protruding section protruding toward the recessed and projecting section and an elastic section that biases the protruding section by elasticity to the recessed and projecting section, and movable in a recess-and-projection direction by the recessed and projecting section when the rotation operation section rotates; an electrode section disposed so as to face the conductive sections, and changing a capacitance in accordance with a movement of the conductive sections; and a detecting section detecting the change in the capacitance. A plurality of sets of combination of the conductive sections and the electrode section are provided. The conductive sections and the electrode section in each set are disposed at positions with different recess-and-projection phases in the recessed and projecting section. The detecting section detects a rotation direction and a rotation quantity of the rotation operation section by means of a combination pattern of the change in the capacitance provided by the electrode section.

According to the above rotation operation device, a plurality of combinations of the conductive section and the electrode section are provided, and the sets of the conductive section and the electrode section are disposed at positions with different recess-and-projection phases in the recessed and projecting section. When the rotation operation section is rotationally operated, capacitances which are generated by the electrode sections change with the move of the conductive sections toward the recessed and projecting section. Then, the detecting section can detect a rotation direction and a rotation quantity of the rotation operation section by means of a combination pattern of the changes in capacitances in the electrode sections.

Here, the electrode sections are disposed so as to face the respective conductive sections. Hence it is possible to detect the rotation direction and the rotation quantity of the rotation operation section without providing the electrode section on the rotation operation section side.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
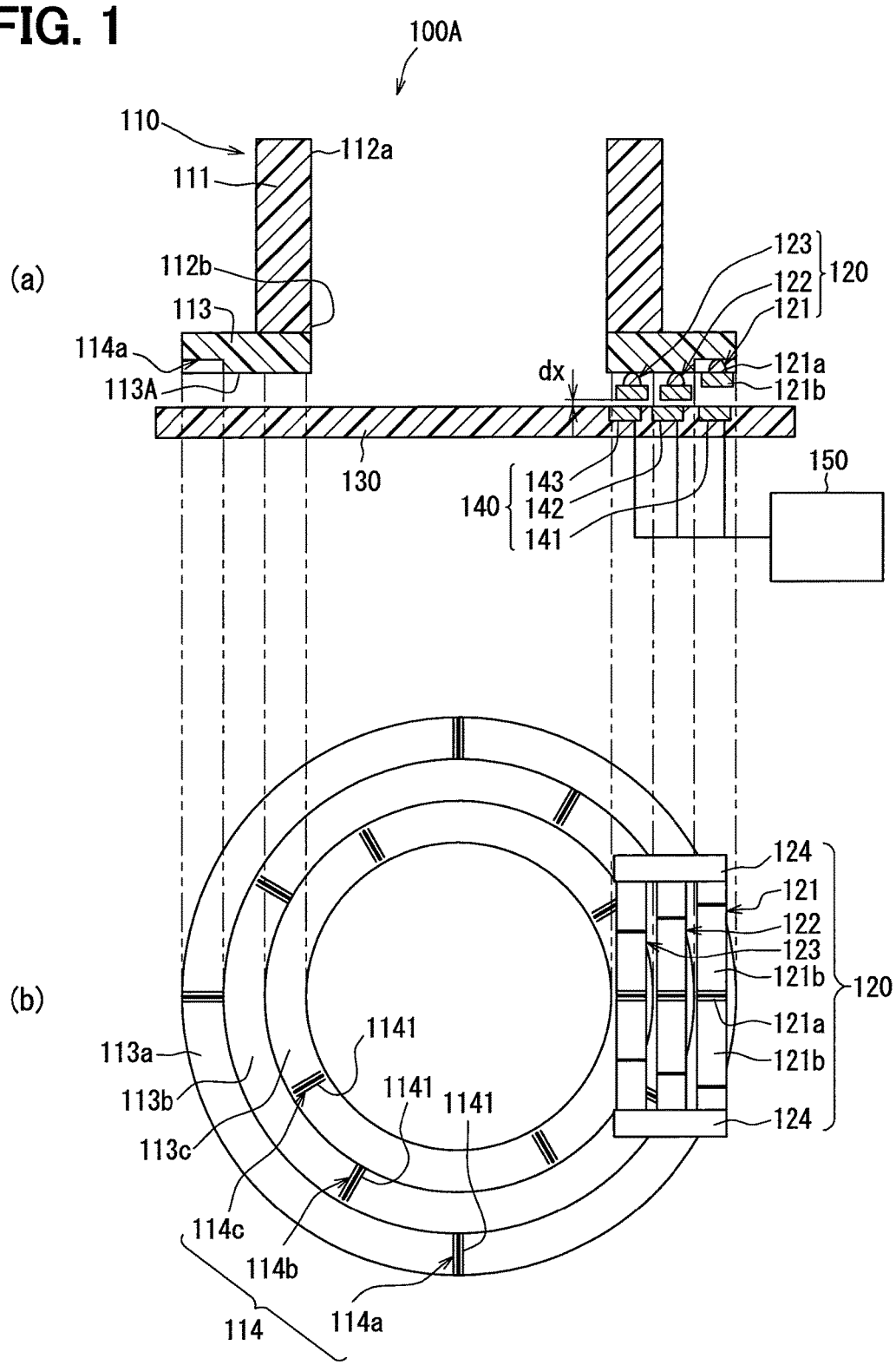
FIG. 1 shows a rotation operation device in a first embodiment, where (a) in FIG. 1 is a sectional view and (b) in FIG. 1 is a bottom view.

Hereinafter, a plurality of modes for implementing the present disclosure will be described with reference to the drawings. In each of the modes, a portion corresponding to an item described in a preceding mode is provided with the same reference numeral, and a repeated description thereof may be omitted. When only part of a configuration is described in each of the modes, the other mode described in advance can be applied to the other portion of the configuration. Not only portions which are specifically demonstrated as being combinable in each of embodiments can be combined, but also embodiments which are not demonstrated as being combinable can be partially combined so long as no particular problem occurs in the combination.

First Embodiment

A rotation operation device 100A of the first embodiment will be described using FIGS. 1 to 3. The rotation operation device 100A of the present embodiment is configured to input an actuation condition for predetermined equipment, and for example, make a setting for inputting a jet air temperature (hereinafter referred to as preset temperature) in a vehicle air conditioner as the predetermined equipment. A crew of the vehicle (an operator of the present disclosure) rotationally operates the rotation operation device 100A so as to set an in-vehicle temperature in accordance with their own favorite temperature, thereby to allow setting of the preset temperature to an arbitrary value in a predetermined temperature range (e.g., 18° C. to 32° C.).

As illustrated in FIG. 1, the rotation operation device 100A is provided with a rotation operation section 110, a conductive section 120, a substrate 130, an electrode section 140, a detecting section 150, and the like. The detecting section 150 is connected to a control section of the air conditioner by a signal line or the like, for example. The rotation operation device 100A is disposed in a position easy for the crew to operate, such as a front surface in a central position of an instrument panel of the vehicle, or the like.

The rotation operation section 110 is formed into a cylindrical shape and supported by a support member (e.g., base holder), not shown, so as to be rotatable about an axis. The rotation operation section 110 is not restricted to rotation of just one turn in a clockwise or counterclockwise direction, but can be rotated a number of turns in each of the directions. The rotation operation section 110 has a body 111 with openings 112a, 112b formed on both axial end sides, and a flange section 113 formed into a circular shape and extended in a direction intersecting with (here, orthogonal to) the axial direction on one axial end side of the body 111.

It is to be noted that a push knob, not shown, can be mounted in an internal space of the body 111. The push knob is an input section which is press-operated by the crew to allow input of a predetermined actuation condition (e.g., on-off condition for the air conditioner).

The surface of the flange section 113 which is on the opposite side to the body 111 is an end surface 113A having a flat ring shape. The end surface 113A has a first region 113a, a second region 113b, and a third region 113c, each having a ring shape, from the radial outside toward the axial central side. Then, three recessed and projecting sections 114 are formed on the end surface 113A.

The three recessed and projecting sections 114 are a first recessed and projecting section 114a formed in the first region 113a, a second recessed and projecting section 114b formed in the second region 113b, a third recessed and projecting section 114c formed in the third region 113c.

In the first region 113a, a plurality of recessed sections 1141 recessed toward the body 111 are formed, which makes the originally flat surface (end surface 113A) a projecting sections (113A) with respect to the recessed sections 1141, and the first recessed and projecting section 114a is thus formed as the repeated recess and projection in a circumferential direction of the first region 113a. The recessed section 1141 is formed, for example, as a groove section going across the first region 113a in the radial direction. Other than this, the recessed section 1141 can also be formed as a circular depression or the like. In the present embodiment, for example, four recessed sections 1141 are provided as the plurality of recessed sections 1141, and disposed at regular intervals in the circumferential direction. That is, in the first region 113a, the recessed section 1141 is disposed at every 90 degrees in the circumferential direction.

The second recessed and projecting section 114b and the third recessed and projecting section 114c are formed similarly to the above first recessed and projecting section 114a. Here, a recessed and projecting position of the second recessed and projecting section 114b and a recessed and projecting position of the third recessed and projecting section 114c are disposed at different positions (displaced positions) in the circumferential direction from the recessed and projecting position of the first recessed and projecting section 114a.

Specifically, the recessed section 1141 in the second recessed and projecting section 114b is disposed at a position displaced by a predetermined angle to one circumferential side from the recessed section 1141 in the first recessed and projecting section 114a. The predetermined angle here is an angle obtained by dividing a space between the recessed sections 1141 in the first recessed and projecting section 114a into three parts, namely 30 degrees. Further, the recessed section 1141 in the third recessed and projecting section 114c is disposed at a position displaced by the predetermined angle (30 degrees) to one circumferential side from the recessed section 1141 in the second recessed and projecting section 114b. That is, when the end surface 113A is seen as a whole, the recessed sections 1141 in the recessed and projecting sections 114a to 114c are disposed in order at every 30 degrees toward one side of the circumferential direction such that a set of the recessed sections 1141 in this order is repeatedly arrayed. Hence on the end surface 113A, during one circumferential circle, twelve recessed sections 1141 appear at regular intervals.

The conductive section 120 is a member made of a conductive material, and has three conductive sections, namely, a first conductive section 121, a second conductive section 122, a third conductive section 123, and a pair of fixed sections 124. As the conductive material, for example, a metal material such as phosphor bronze is used. Each of the conductive sections 121, 122, 123 forms a similar structure.

That is, each of the conductive sections 121, 122, 123 is formed of the a narrow plate member as a base. A region bent in an inverted U-shape is formed in a longitudinal central section of the plate member, and this region is a protruding section 121a. A protruding tip of the protruding section 121a has a circular shape. Then, the original plate section extends like both arms from both ends in the reversed U-shape, and this region is an elastic section 121b. The elastic section 121b is a region that forms a so-called plate spring.

The conductive sections 121, 122, 123 are arrayed such that long sides of the elastic sections 121b are adjacent to one another, and arrayed in order of the conductive sections 121, 122, 123. Further, both longitudinal ends of each of the elastic sections 121b are fixed by the fixed sections 124. That is, each of the conductive sections 121, 122, 123 is integrated by the fixed sections 124, to form the conductive section 120.

Both the fixed sections 124 of the conductive section 120 are supported by a fixation member, not shown. At this time, the tips of the protruding sections 121a of the conductive sections 121, 122, 123 are disposed such that the tips are respectively directed to the recessed and projecting sections 114a, 114b, 114c, and that the longitudinal directions of the elastic sections 121b are respectively directed to tangential directions of the ring-shaped regions 113a, 113b, 113c. The protruding section 121a of the first conductive section 121 corresponds to the first recessed and projecting section 114a. The protruding section 121a of the second conductive section 122 corresponds to the second recessed and projecting section 114b. The protruding section 121a of the third conductive section 123 corresponds to the third recessed and projecting section 114c.

Then, the protruding sections 121a of the conductive sections 121, 122, 123 are biased so as to come into contact with the recessed and projecting sections 114a, 114b, 114c sides by elasticity of the elastic sections 121b. Hence, when the rotation operation section 110 is rotationally operated, the protruding sections 121a move in the axial direction of the rotation operation section 110 together with the elastic sections 121b along the recessed sections 1141, or the projecting sections (113A), of the recessed and projecting sections 114a, 114b, 114c. That is, when each protruding section 121a gets into the recessed section 1141, the protruding section 121a moves to the body 111 side, and on the contrary, when each protruding section 121a is in contact with the protruding section (113A), the protruding section 121a moves to the opposite side to the body 111.

Since the conductive sections 121, 122, 123 respectively correspond to the recessed and projecting sections 114a, 114b, 114c, the conductive sections 121, 122, 123 are disposed in order of the conductive sections 121, 122, 123 so as to be located on the central side of the rotation operation section 110. Spring constants in the elastic sections 121b of the conductive sections 121, 122, 123 are set so as to increase in order of the first conductive section 121, the second conductive section 122, and the third conductive section 123. When the spring constant is sequentially increased, biased force that biases the protruding section 121a to each of the recessed and projecting sections 114a, 114b, 114c sequentially increases.

Adjustment of the spring constant is possible by adjusting a plate thickness and a width of the elastic section 121b, a substantial length which functions as the elastic section, or the like.

The substrate 130 is a plate-like member (printed substrate) made of resin for mounting the electrode section 140, described later, via a printed wiring section formed on the surface of the substrate 130. The substrate 130 is disposed on the flange section 113 side of the rotation operation section 110, so as to face the conductive section 120.

The electrode section 140 has three electrode sections, namely, a first electrode section 141, a second electrode section 142, and a third electrode section 143. The electrode sections 141, 142, 143 are mounted on the surface of the substrate 130 on the conductive section 120 side. Each of the electrode sections 141, 142, 143 is a fixed electrode section that is fixed to the substrate 130. The first electrode section 141 is disposed so as to correspond to the position of the protruding section 121a of the first conductive section 121. The second electrode section 142 is disposed so as to correspond to the position of the protruding section 121a of the second conductive section 122. The third electrode section 143 is disposed so as to correspond to the position of the protruding section 121a of the third conductive section 123.

Each of the electrode sections 141, 142, 143 forms a capacitor between itself and the opposite conductive section 120 (protruding section 121a), and changes a capacitance in accordance with a distance dx therebetween, which changes when the protruding section 121a is moved by each of the recessed and projecting sections 114a, 114b, 114c. The electrode section 140 is used here as a capacitance-type sensor. The capacitance obtained by each of the electrode sections 141, 142, 143 is inversely proportional to the distance dx.

Specifically, in the first electrode section 141, when the protruding section 121a gets into the recessed section 1141, the distance dx between the protruding section 121a and the first electrode section 141 increases and the capacitance value decreases. On the other hand, when the protruding section 121a is in the state of being in contact with the protruding section (113A), the distance dx between the protruding section 121a and the first electrode section 141 decreases and the capacitance value increases. This also applies to the second electrode section 142 and the third electrode section 143. Each of the electrode sections 141, 142, 143 outputs a capacitance signal to the detecting section 150 described later.

As described above, the first recessed and projecting section 114a, the first conductive section 121, and the first electrode section 141 constitute one set (combination). Similarly, the second recessed and projecting section 114b, the second conductive section 122, and the second electrode section 142 constitute a second set. Further, the third recessed and projecting section 114c, the third conductive section 123, and the third electrode section 143 constitute a third set.

The detecting section 150 detects a change in capacitance from a capacitance signal outputted from each of the electrode sections 141, 142, 143. Here, the detecting section 150 determines which signal the obtained capacitance value is, a Hi-signal or a Lo-signal, based on a previously set predetermined threshold, to capture the capacitance signal from each of the electrode sections 141, 142, 143 as a signal waveform as shown in FIG. 2. The Lo-signal can be seen as a signal at the time when the protruding section 121a gets into the recessed section 1141. Further, the Hi-signal can be seen as a signal at the time when the protruding section 121a is in contact with the protruding section (113A). It is to be noted that in FIG. 2, symbol A denotes a signal waveform of the first electrode section 141, symbol B denotes a signal waveform of the second electrode section 142, and symbol C denotes a signal waveform of the third electrode section 143.

Next, there will be described actuation of the rotation operation device 100A on the basis of the above configuration and function effects thereof.

When the crew rotates the rotation operation section 110 in either direction so as to change the preset temperature of the air conditioner, the recessed section 1141 of each of the recessed and projecting sections 114a, 114b, 114c moves in the circumferential direction. Accordingly, the protruding section 121a of each of the conductive sections 121, 122, 123 gets into the recessed section 1141, or comes into contact with the protruding section (113A).

The behavior of the protruding section 121a of each of the conductive sections 121, 122, 123 getting into the recessed section 1141 is as follows. The protruding section 121a in one set gets into the recessed section 1141 of the recessed and projecting section in one set. When rotation is further continued in the same direction, the protruding section 121a in the adjacent set then gets into the recessed section 1141 of the recessed and projecting section in the adjacent set, and this is continuously performed. The same also applies to the inverse rotation direction. That is, the timings at which the protruding sections 121a of the conductive sections 121, 122, 123 get into the recessed sections 1141 of the recessed and projecting sections 114a, 114, 114c are different timings. Further, a quantity of rotation from the time of entry of the protruding section 121a in one set into the recessed section 1141 in one set to the time of entry of the protruding section 121a in the adjacent set into the recessed section 1141 in the adjacent set is equal to the interval between the recessed sections 1141 in the circumferential direction. The interval is 30 degrees here as described above.

Figures 2, 3:
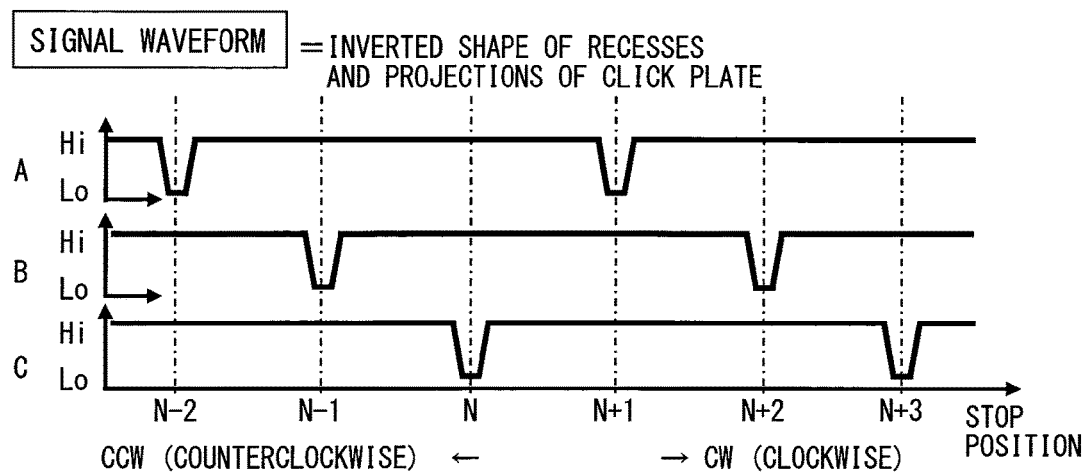
FIG. 2 is a graph showing a signal waveform in an electrode section in the first embodiment.
FIG. 3 is a table showing a logic for detecting a rotation direction in the first embodiment.

In accordance with this behavior of the protruding section 121a, the respective distances dx between the conductive sections 121, 122, 123 and the electrode sections 141, 142, 143 change, and the detecting section 150 obtains signal waveforms A, B, C described in FIG. 2.

Then, using the combination pattern of changes in signal waveforms A, B, C, the detecting section 150 detects the direction and quantity of the operated rotation of the rotation operation section 110 based on a detection logic shown in FIG. 3. The detection logic is as follows. That is, in the signal waveforms A, B, C last time and the signal waveforms A, B, C this time during the rotation operation, when the Hi-signal changes from A to B, B to C or C to A, determination of +1 is made, to determine that the rotation direction is clockwise. On the other hand, in the signal waveforms A, B, C last time and the signal waveforms A, B, C this time, when the Hi-signal changes from C to B, B to A or A to C, determination of −1 is made, to determine that the rotation direction is counterclockwise.

When the rotation operation by the crew is continued in the same direction, the detecting section 150 repeats the above determination and counts the number of times +1 is obtained or the number of times −1 is obtained, to calculate a quantity of clockwise or counterclockwise rotation. The rotation quantity is calculated by: Number of times of +1 (or −1)×Interval (30 degrees) between recessed sections 1141.

Further, the detecting section 150 outputs the rotation direction and the rotation quantity obtained above to a control section of the air conditioner, not shown. Accordingly, the control section changes the preset temperature. For example, the preset temperature is increased when the rotation operation section 110 is rotated clockwise, and the preset temperature is lowered when the rotation operation section 110 is rotated counterclockwise. Further, the control section changes an increased quantity or a lowered quantity of the preset temperature in accordance with the rotation quantity.

It is to be noted that in the present embodiment, an absolute position in the rotation direction of the rotation operation section 110 is not grasped, but a relative position, or how much rotation quantity has been inputted in which direction from the current rotation position, is grasped.

Therefore, how many times the rotation operation section 110 is rotated clockwise or counterclockwise while the rotation operation is repeated, there is no substantial disadvantages, and for example, it is unnecessary to perform the operation of getting the rotation operation section 110 back to a reference position.

As described above, in the present embodiment, three or more sets (here, three sets) of the recessed and projecting section 114, the conductive section 120, and the electrode section 140 are provided. Then, the conductive sections 121, 122, 123 are moved in order in the recess-and-projection direction by the respective recessed and projecting sections 114a, 114b, 114c at different timings being taken at regular intervals. When the rotation operation section 110 is rotationally operated, capacitances which are generated by the electrode sections 141, 142, 143 change with the move of the conductive sections 121, 122, 123 toward the recessed and projecting sections 114a, 114b, 114c. Then, the detecting section 150 can detect the rotation direction and the rotation quantity of the rotation operation section 110 by means of a combination pattern of the changes in capacitances in the electrode sections 141, 142, 143.

Here, the electrode sections 141, 142, 143 are mounted on the substrate 130 which faces the conductive sections 120. Hence it is possible to detect the rotation direction and the rotation quantity of the rotation operation section 110 without providing the electrode section 140 on the rotation operation section 110 side.

Further, in the present embodiment, rotating the rotation operation section 110 leads the protruding sections 121a to sequentially get into the recessed sections 1141 of the recessed and projecting sections 114a, 114b, 114c, and hence it is possible to obtain an appropriate click feeling (moderation feeling). That is, in the present embodiment, the recessed and projecting section 114, the protruding section 121a, and the elastic section 121b are also provided with a click feeling generating function (moderation feeling generating function) for generating a click feeling. This eliminates the need for providing a dedicated click feeling generating mechanism, thus allowing reduction in number of product parts.

Further, the recessed and projecting sections 114 are formed on the end surface 113A, and the elastic sections 121b in the three or more sets are disposed so as to be arrayed in the radial direction of the end surface 113A. Then, the biased force generated by the elasticity of each of the elastic sections 121b is set by adjusting the spring constant such that the biased force generated by the elasticity is larger in the elastic section 121b located closer to the radial inside of the rotation operation section 110.

Accordingly, the smaller the radial size, the larger the biased force to each protruding section 121a, and hence it is possible to make a torque value (=radial size×biased force) equivalent at the time of each protruding section 121a getting into the recessed section 1141 or coming into contact with the protruding section (113A) when the rotation operation section 110 is rotated. Hence the click feeling at the time of rotation operation can be made uniform.

Further, the conductive sections 121, 122, 123 in the three or more sets are integrally formed by the fixed sections 124, thereby to allow improvement in assemblability.

Second Embodiment

Figure 4:
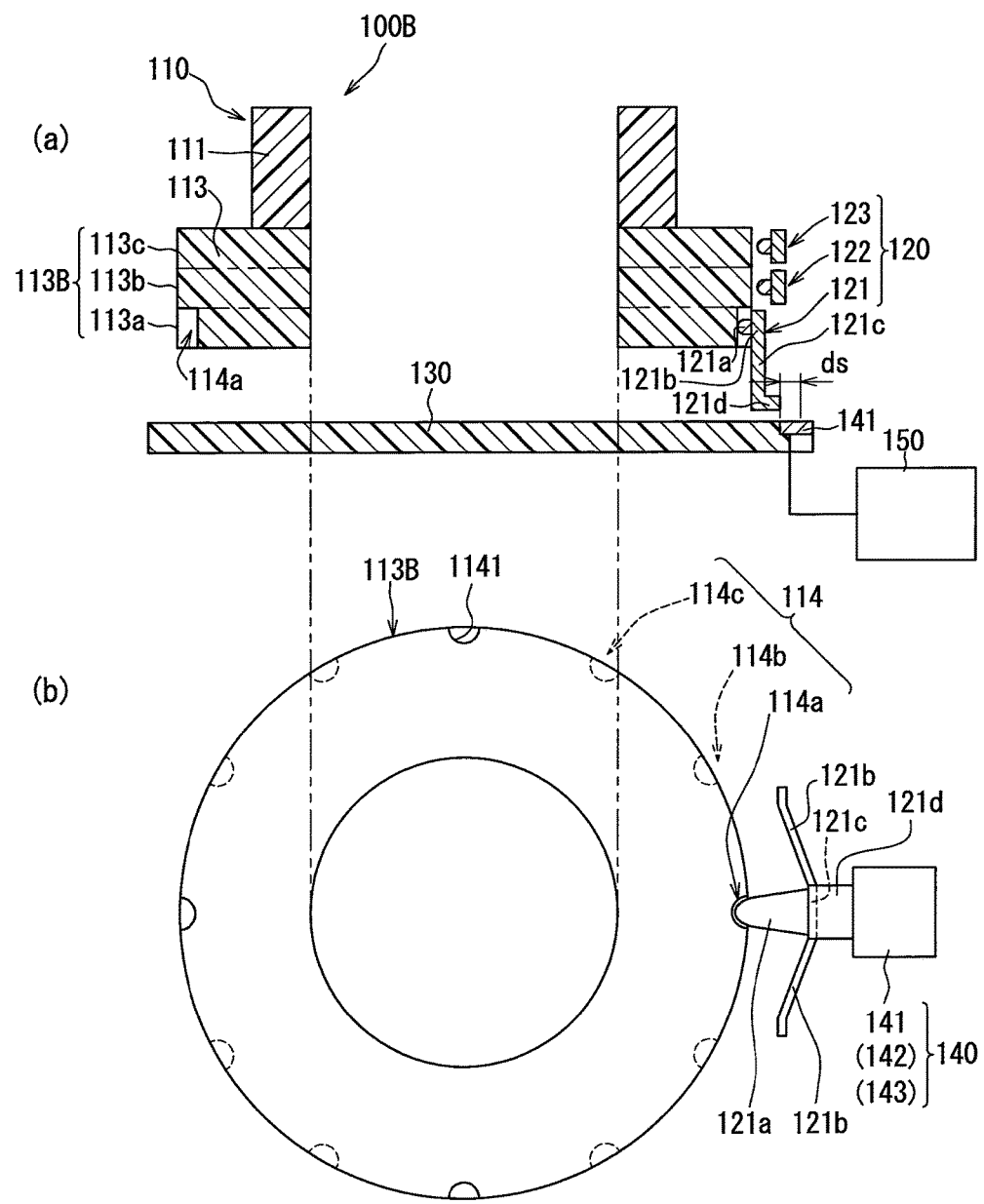
FIG. 4 shows a rotation operation device in a second embodiment, where (a) in FIG. 4 is a sectional view and (b) in FIG. 4 is a bottom view.

FIG. 4 shows a rotation operation device 100B of the second embodiment. The rotation operation device 100B of the second embodiment is configured by providing the first recessed and projecting section 114a, the second recessed and projecting section 114b, and the third recessed and projecting section 114c as the recessed and projecting sections 114 on a peripheral surface 113B of the rotation operation section 110, and respectively disposing the conductive sections 121, 122, 123 for the recessed and projecting sections 114a, 114b, 114c.

The peripheral surface 113B is formed as the peripheral surface of the flange section 113. The peripheral surface 113B has the first region 113a, the second region 113b, and the third region 113c from the substrate 130 side to the body 111 side in the axial direction of the flange section 113. Three recessed and projecting sections 114 are formed on the peripheral surface 113B.

The three recessed and projecting sections 114 are the first recessed and projecting section 114a formed in the first region 113a, the second recessed and projecting section 114b formed in the second region 113b, the third recessed and projecting section 114c formed in the third region 113c.

In the first region 113a, a plurality of recessed sections 1141 recessed from the peripheral surface 113B to the axis side of the body 111 are formed, which makes the original peripheral surface 113B projecting sections (113B) with respect to the recessed sections 1141, and the first recessed and projecting section 114a is thus formed as the repeated recess and projection in a circumferential direction of the first region 113a. Each recessed section 1141 is formed, for example, as a groove section going across the first region 113a in the axial direction. Other than this, the recessed sections 1141 can also be formed as circular depression or the like. In the present embodiment, for example, four recessed sections 1141 are provided as the plurality of recessed sections 1141, and disposed at regular intervals in the circumferential direction. That is, in the first region 113a, the recessed section 1141 is disposed at every 90 degrees in the circumferential direction.

The second recessed and projecting section 114b and the third recessed and projecting section 114c are formed similarly to the above first recessed and projecting section 114a. Here, a recessed and projecting position of the second recessed and projecting section 114b and a recessed and projecting position of the third recessed and projecting section 114c are disposed at different positions (displaced positions) in the circumferential direction from the recessed and projecting position of the first recessed and projecting section 114a.

Specifically, the recessed section 1141 in the second recessed and projecting section 114b is disposed at a position displaced by a predetermined angle to one circumferential side from the recessed section 1141 in the first recessed and projecting section 114a. The predetermined angle here is an angle obtained by dividing a space between the recessed sections 1141 in the first recessed and projecting section 114a into three parts, namely 30 degrees. Further, the recessed section 1141 in the third recessed and projecting section 114c is disposed at a position displaced by the predetermined angle (30 degrees) to one circumferential side from the recessed section 1141 in the second recessed and projecting section 114b. That is, when the peripheral surface 113B is seen as a whole, the recessed sections 1141 in the recessed and projecting sections 114a to 114c are disposed in order at every 30 degrees toward one side of the circumferential direction such that a set of the recessed sections 1141 in this order is repeatedly arrayed. Hence on the peripheral surface 113B, during one circumferential circle, twelve recessed sections 1141 appear at regular intervals.

The conductive section 120 is a member made of a conductive material, and has three conductive sections, namely, the first conductive section 121, the second conductive section 122, and the third conductive section 123. As the conductive material, for example, a metal material such as phosphor bronze is used. Each of the conductive sections 121, 122, 123 forms a similar structure.

That is, each of the conductive sections 121, 122, 123 has the protruding section 121a, the elastic section 121b, an extended section 121c, and a bent section 121d. The protruding section 121a is a region protruding toward each of the recessed and projecting sections 114a, 114b, 114c. A protruding tip of the protruding section 121a has a circular shape. The elastic section 121b is formed of a narrow plate member, and the protruding section 121a is connected to a longitudinal central section of the plate member. The elastic section 121b is disposed in such a direction as to be longitudinally intersecting with (here, orthogonal to) the axis of the rotation operation section 110. The elastic section 121b is a region that forms a so-called plate spring.

Further, the extended section 121c is a plate-shape region extending from the central section of the elastic section 121b toward the substrate 130 side. Moreover, the bent section 121d is a region bent in a plate form at the extended tip of the extended section 121c, so as to face the surface of the substrate 130.

In the conductive sections 121, 122, 123, the respective protruding sections 121a are disposed at the same position in the circumferential direction of the flange section 113, so as to be arrayed in the axial direction. Additionally, by employing an overhanging shape to the extended section 121c, or by some other means, three bent sections 121d are formed and disposed so as not to overlap with each other. Then, both longitudinal ends of each elastic section 121b are supported by a fixation member, not shown. The protruding section 121a of the first conductive section 121 corresponds to the first recessed and projecting section 114a. The protruding section 121a of the second conductive section 122 corresponds to the second recessed and projecting section 114b. The protruding section 121a of the third conductive section 123 corresponds to the third recessed and projecting section 114c.

Then, the protruding sections 121a of the conductive sections 121, 122, 123 are biased so as to come into contact with the recessed and projecting sections 114a, 114b, 114c by elasticity of the elastic sections 121b. Hence, when the rotation operation section 110 is rotationally operated, the protruding sections 121a move in the radial direction of the rotation operation section 110 together with the elastic sections 121b along the recessed sections 1141, or the projecting sections (113B), of the respective recessed and projecting sections 114a, 114b, 114c. Accordingly, each bent section 121d is also moved in the radial direction of the rotation operation section 110 via the corresponding extended section 121c.

In the present embodiment, since the protruding sections 121a are biased so as to come into contact with the recessed and projecting sections 114a, 114b, 114c formed on the peripheral surface 113B of the flange section 113, the radial positions of the flange section 113 are the same, and hence the spring constants in the elastic sections 121b are the same.

The electrode section 140 has three electrode sections, namely, the first electrode section 141, the second electrode section 142, and the third electrode section 143. The electrode sections 141, 142, 143 are mounted on the surface of the substrate 130 on the conductive section 120 side. Each of the electrode sections 141, 142, 143 is a fixed electrode section that is fixed to the substrate 130. The first electrode section 141 is disposed so as to correspond to the position of the bent section 121d of the first conductive section 121. The second electrode section 142 is disposed so as to correspond to the position of the bent section 121d of the second conductive section 122. The third electrode section 143 is disposed so as to correspond to the position of the bent section 121d of the third conductive section 123. Positions of each bent section 121d and each electrode section 143 are set so as to form a predetermined space therebetween.

Each of the electrode sections 141, 142, 143 forms a capacitor between itself and the opposite conductive section 120 (bent section 121d). When the protruding section 121a and the bent section 121d are moved by each of the recessed and projecting sections 114a, 114b, 114c, each of the electrode sections 141, 142, 143 changes a capacitance by a change in area dS (hereinafter referred to as overlap area dS) in which the bent section 121d and each of the electrode sections 141, 142, 143 overlap. A capacitance-type sensor is used here for the electrode section 140. The capacitance obtained by each of the electrode sections 141, 142, 143 is proportional to the overlap area dS.

Specifically, in the first electrode section 141, when the protruding section 121a gets into the recessed section 1141, the overlap area dS of the bent section 121d to the first electrode section 141 decreases and the capacitance value decreases. On the other hand, when the protruding section 121a is in the state of being in contact with the projecting section (113B), the overlap area dS of the bent section 121d to the first electrode section 141 increases and the capacitance value increases. This also applies to the second electrode section 142 and the third electrode section 143. Each of the electrode sections 141, 142, 143 outputs a capacitance signal to the detecting section 150.

Similarly to the first embodiment, the detecting section 150 detects the signal waveforms A, B, C described in FIG. 2 based on the capacitance signals, and by use of the combination pattern of changes in the signal waveforms A, B, C, the detecting section 150 detects the direction and quantity of the operated rotation of the rotation operation section 110 on the basis of the detection logic on the basis of FIG. 3. Hence it is possible in the present embodiment to obtain a similar effect to the above first embodiment. That is, it is possible to detect the rotation direction and the rotation quantity of the rotation operation section 110 without providing the electrode section 140 on the rotation operation section 110 side. Further, it is possible to obtain the click feeling at the time of rotation operation by the recessed and projecting section 114, the protruding section 121a, and the elastic section 121b.

Third Embodiment

A rotation operation device 100C of the third embodiment will be described with reference to FIGS. 5 to 8. Compared to the rotation operation device 100A of the above first embodiment, the rotation operation device 100C of the present embodiment is provided with a plurality of (here, two) conductive sections 121, 122 and a plurality of (here, two) electrode sections 141, 142 with respect to one recessed and projecting section 114, to detect the rotation direction and the rotation quantity of the rotation operation section 110.

Figure 5:
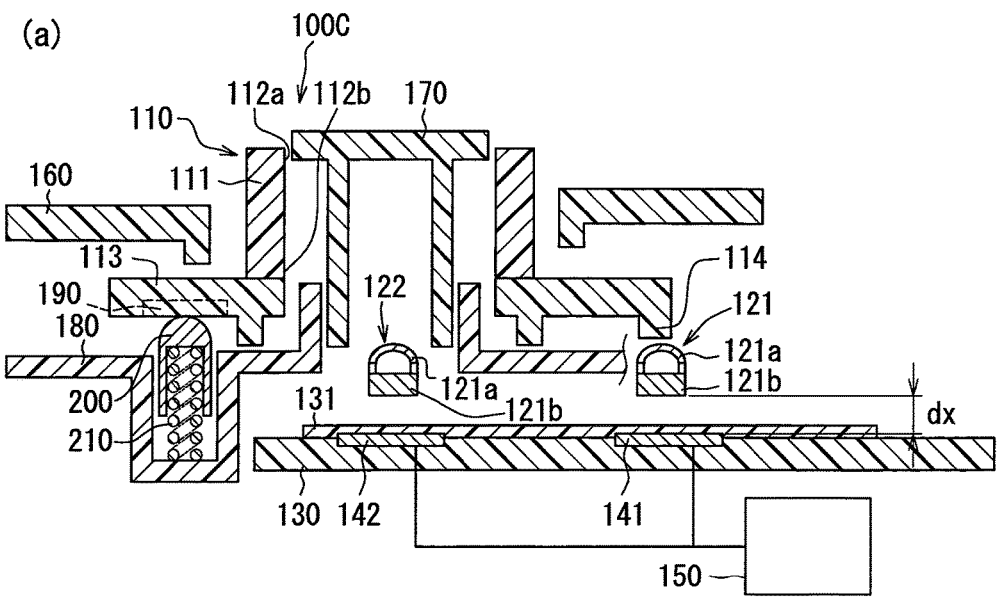
FIG. 5 shows a rotation operation device in a third embodiment, where (a) in FIG. 5 is a sectional view and (b) in FIG. 5 is a bottom view.
Figure 5:
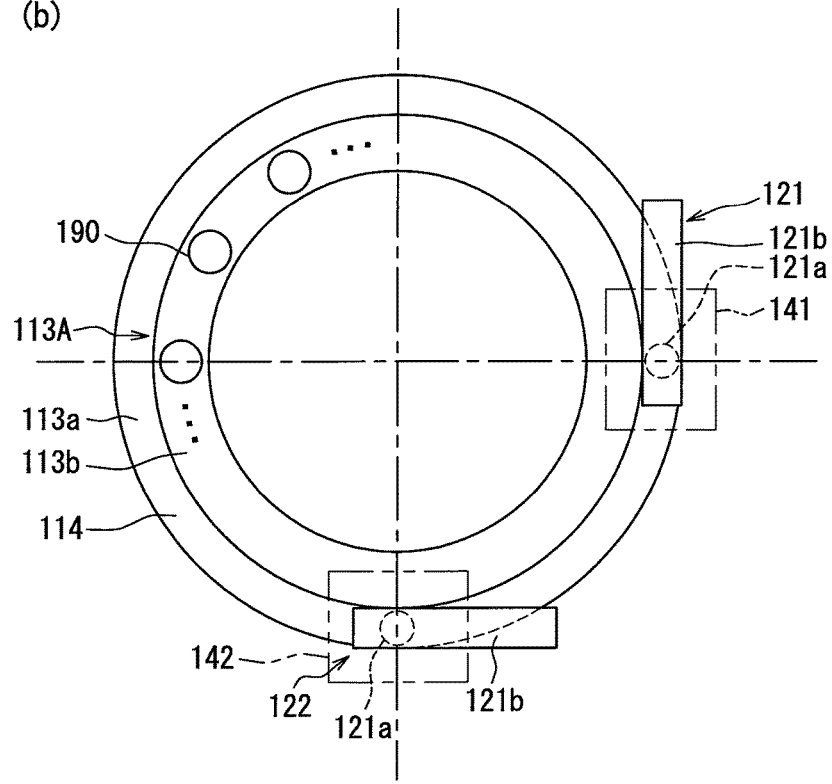

As shown in FIG. 5, the rotation operation device 100C is disposed such that the tip of the rotation operation section 110 on the crew side is protruded from a front case 160. Further, a push knob 170 for pressing operation is provided on the central side of the rotation operation section 110. Moreover, a base holder 180 is placed between the flange section 113 of the rotation operation section 110 and the substrate 130.

Similarly to the above first embodiment, the rotation operation section 110 is provided with the body 111 and the flange section 113. The surface, which is on the opposite side to the body 111, of the flange section 113 is an end surface 113A having a flat ring shape. The end surface 113A has the ring-shaped first region 113a and second region 113b from the radial outside toward the axial central side.

Figure 6:
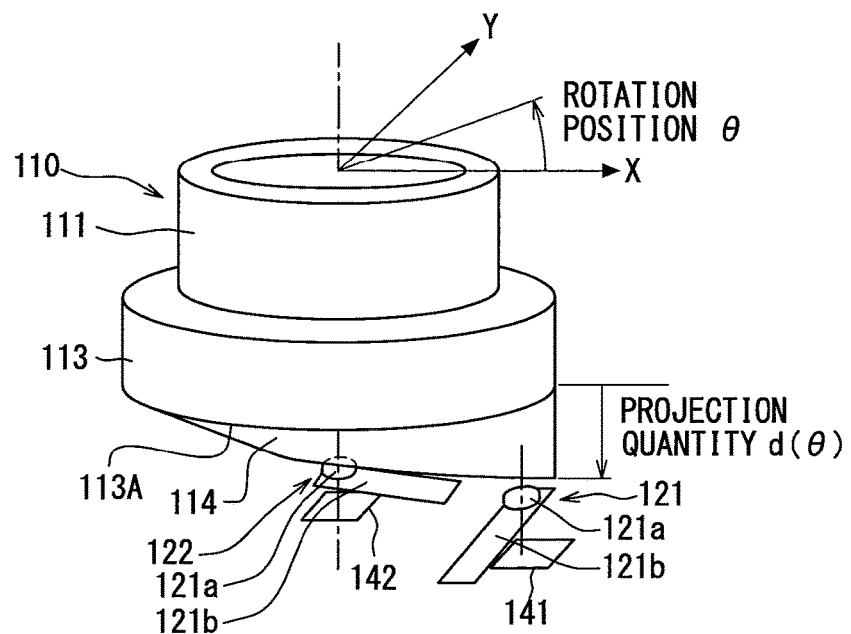
FIG. 6 is a perspective view showing an external appearance of the rotation operation section in the third embodiment.
Figure 7:
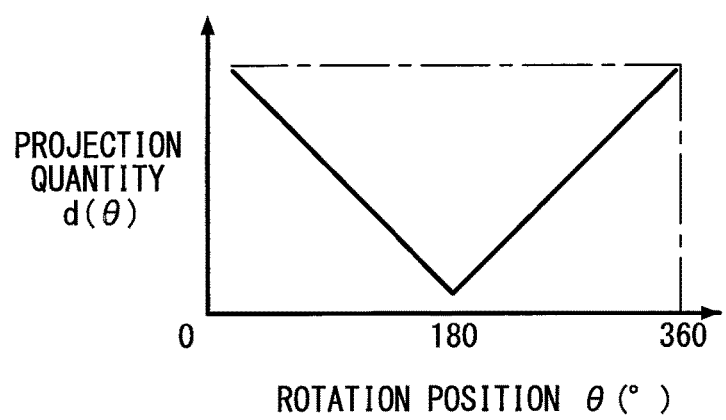
FIG. 7 is a graph showing a relation between a rotation position and a projection quantity in the third embodiment.

The recessed and projecting section 114 having a continuous slope in the circumferential direction is formed in the first region 113a. The three recessed and projecting sections 114a, 114b, 114c have been formed in the above first embodiment, whereas one recessed and projecting section 114 is formed here. As shown in FIGS. 6 and 7, the recessed and projecting section 114 is formed such that a projection quantity $d(\theta)$ of the projecting section projecting from the end surface 113A shifts from the maximum value to zero during half a circle of the first region 113a, and the projection quantity $d(\theta)$ shifts back to the maximum value in another half the circle.

It is to be noted that the second region 113b is formed with recessed sections 190 intermittently disposed at regular intervals in the circumferential direction. Then, the base holder 180 is provided with a plunger 200 plunging toward the recessed section 190, and a spring 210 that biases the plunger 200 to the second region 113b side. In the present embodiment, the recessed section 190, the plunger 200, and the spring 210 form the click feeling generating mechanism.

The conductive section 120 is a member made of a conductive material, and has two conductive sections, namely, the first conductive section 121 and the second conductive section 122. As the conductive material, for example, a metal material such as phosphor bronze is used. Each of the conductive sections 121, 122 forms a similar structure.

That is, each of the conductive sections 121, 122 is formed by providing the protruding section 121a on one longitudinal end side of the elastic section 121b that forms a narrow plate member. A protruding tip of the protruding section 121a has a circular shape. The elastic section 121b is a region that forms a so-called plate spring.

The other end side of the elastic section 121b in each of the conductive sections 121, 122 is fixed to the substrate 130, for example. At this time, the conductive sections 121, 122 are each disposed such that the tip of each protruding section 121a is directed to the recessed and projecting section 114. Further, the conductive sections 121, 122 are disposed such that the longitudinal direction of each elastic section 121b is directed to the tangential direction of the ring-shaped first region 113a. Moreover, the first conductive section 121 and the second conductive section 122 are disposed at positions with different recess-and-projection phases in the recessed and projecting section 114. Here, the first conductive section 121 and the second conductive section 122 are disposed at positions 90 degrees separate from each other in the circumferential direction of the recessed and projecting section 114 (an X-directional position and a Y-directional position in FIG. 6).

Then, the protruding sections 121a of the conductive sections 121, 122 are biased so as to come into contact with the recessed and projecting section 114 by elasticity of the elastic sections 121b. Hence, when the rotation operation section 110 is rotationally operated, the protruding sections 121a move in the axial direction of the rotation operation section 110 along the recessed and projecting section 114. That is, in each protruding section 121a, a place with a small projection quantity d(θ) of the recessed and projecting section 114 moves to the body 111 side, and on the other hand, a place with a large projection quantity d(θ) of the recessed and projecting section 114 moves to the opposite side to the body 111.

In the present embodiment, each protruding section 121a is disposed at the same radial position on the end surface 113A and hence, differently from the above first embodiment, the spring constant in each elastic section 121b is the same.

The electrode section 140 has two electrode sections, namely, the first electrode section 141 and the second electrode section 142. The electrode sections 141, 142 are mounted on the surface of the substrate 130 on the conductive section 120 side. Each of the electrode sections 141, 142 is a fixed electrode section that is fixed to the substrate 130. The first electrode section 141 is disposed so as to correspond to the position of the protruding section 121a of the first conductive section 121. The second electrode section 142 is disposed so as to correspond to the position of the protruding section 121a of the second conductive section 122. An insulating layer 131 is provided on the substrate 130, and the surface of each of the electrode sections 141, 142 is covered by the insulating layer 131.

The electrode sections 141, 142 form capacitors between themselves and the respective opposite conductive sections 121, 122 (protruding sections 121a), and change capacitances in accordance with distances dx, dy therebetween, which change when the protruding sections 121a move by the recessed and projecting sections 114. A capacitance-type sensor is used here for each of the electrode sections 141, 142. The distance dx is a distance between the conductive section 121 and the electrode section 141, and the distance dy is a distance between the conductive section 121 and the electrode section 142.

Figure 8:
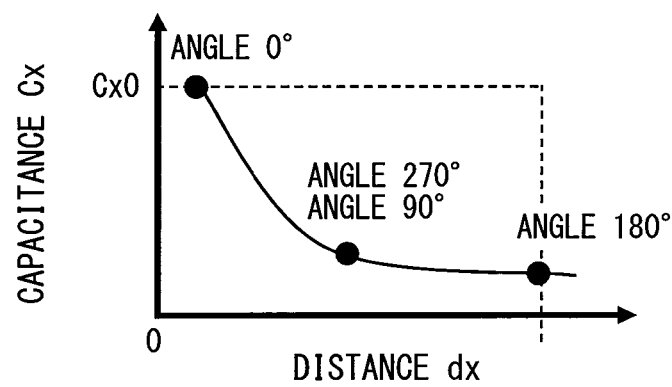
FIG. 8 is a graph each showing a relation between a distance of an electrode section to a conductive section and a capacitance in the third embodiment, where (a) in FIG. 8 shows a distance dx and (b) in FIG. 8 shows a distance dy.
Figure 8:
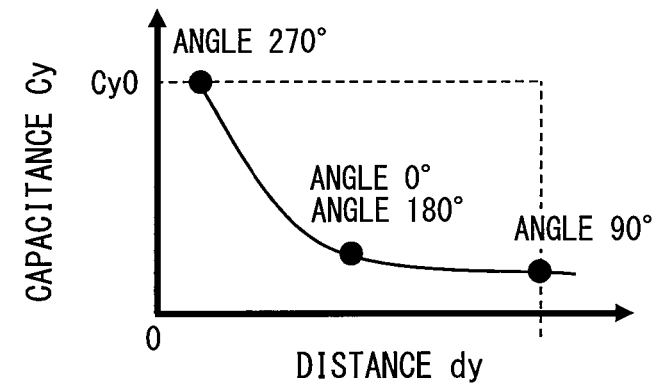

As shown in FIG. 8, capacitances Cx, Cy obtained by the respective electrode sections 141, 142 are inversely proportional to the distances dx, dy. The capacitance Cx is a capacitance of the electrode section 141, and the capacitance Cy is a capacitance of the electrode section 142.

Here, on the substrate 130, a 0-degree position, a 90-degree position, a 180-degree position, and a 270-degree position clockwise are assumed as coordinate positions in the rotation direction of the rotation operation section 110. Further, the position of the electrode section 141 is taken as the 0-degree position, and the position of the electrode section 142 is taken as the 270-degree position. Moreover, in the circumferential direction of the recessed and projecting section 114, the position of the maximum projection quantity is taken as a reference point. The capacitance Cx in the electrode section 141 at the time of the reference point passing through each angle position by rotation operation of the rotation operation section 110 is as shown in (a) of FIG. 8, and the capacitance Cy in the electrode section 142 is as shown in (b) of FIG. 8. The capacitances Cx, Cy have non-linear relations with the respective distances dx, dy. The electrode sections 141, 142 respectively output capacitance signals Cx, Cy to the detecting section 150.

The detecting section 150 detects a pattern of combination of changes in capacitances from the capacitance signals Cx, Cy outputted from the respective electrode sections 141, 142. The capacitance combination pattern is as follows in the present embodiment.

That is, from FIG. 8, when the capacitance Cx and the capacitance Cy are simultaneously observed, for example, different combinations of the capacitance values are obtained as follows: Cx is the maximum value and Cy is an intermediate value when the reference point is at the 0-degree position; Cx is the intermediate value and Cy is the minimum value when the reference point is at the 90-degree position; Cx is the minimum value and Cy is the intermediate value when the reference point is at the 180-degree position; and Cx is the intermediate value and Cy is the maximum value when the reference point is at the 270-degree position.

The detecting section 150 previously stores characteristic diagrams shown in FIG. 8. When the rotation operation section 110 is rotationally operated, the detecting section 150 grasps the combination pattern of both the capacitances Cx, Cy based on the stored characteristic diagram, to detect the rotation position θ, and can thus detect the position of the maximum protruding section (reference point) in the recessed and projecting section 114 on the rotational coordinates. This allows detection of the rotation direction and the rotation quantity of the rotation operation section 110.

As described above, in the present embodiment, a plurality of (here, two) combinations of the conductive section 120 and the electrode section 140 are provided with respect to one recessed and projecting section 114, and the respective sets of the conductive section 120 and the electrode section 140 are disposed at positions with different recess-and-projection phases in the recessed and projecting section 114. When the rotation operation section 110 is rotationally operated, capacitances which are generated by the electrode sections 141, 142 change with the move of the conductive sections 121, 122 toward the recessed and projecting section 114. Then, the detecting section 150 can detect the rotation direction and the rotation quantity of the rotation operation section 110 by means of a combination pattern of the changes in capacitances in the electrode sections 141, 142.

Here, the electrode sections 141, 142 are mounted on the substrate 130 which faces the conductive sections 121, 122. Hence it is possible to detect the rotation direction and the rotation quantity of the rotation operation section 110 without providing the electrode section 140 on the rotation operation section 110 side.

Fourth Embodiment

FIGS. 9 to 12 show a rotation operation device 100D of the fourth embodiment. Compared to the rotation operation device 100C of the above third embodiment, the rotation operation device 100D of the fourth embodiment is configured by providing the recessed and projecting section 114 on the peripheral surface 113B of the rotation operation section 110, and disposing each of the conductive sections 121, 122 to the recessed and projecting section 114.

Figure 9:
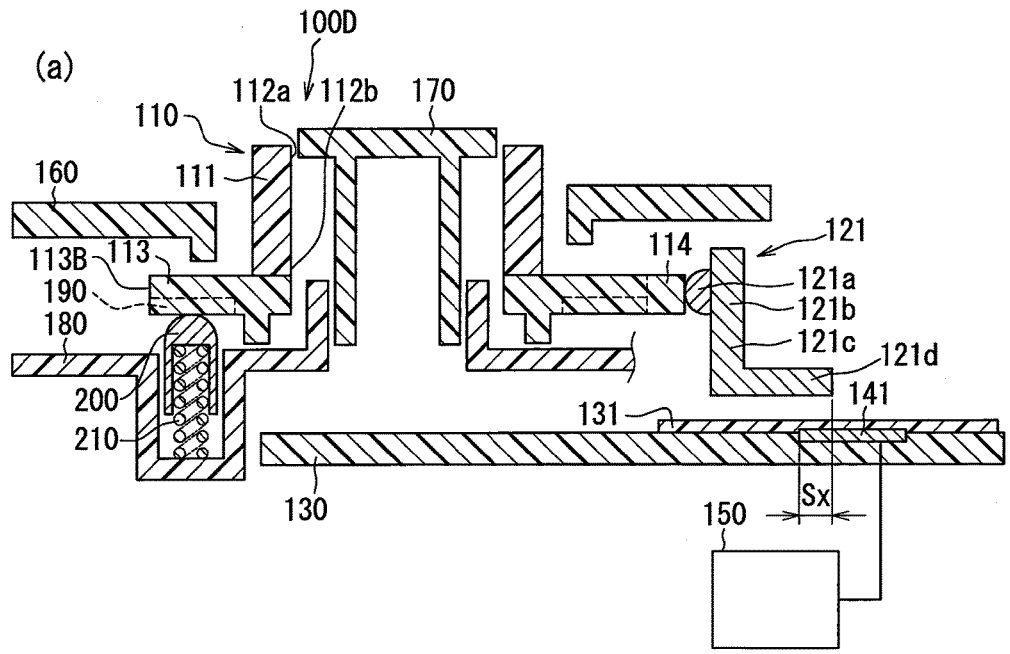
FIG. 9 shows a rotation operation device in a fourth embodiment, where (a) in FIG. 9 is a sectional view and (b) in FIG. 9 is a bottom view.
Figure 9:
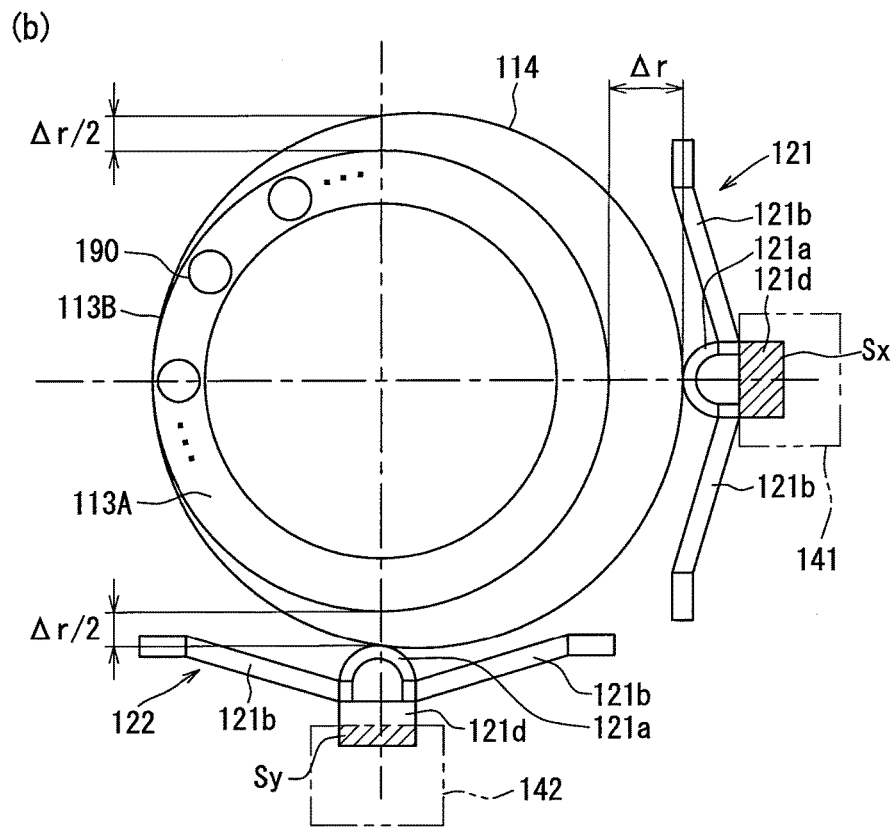
Figure 10:
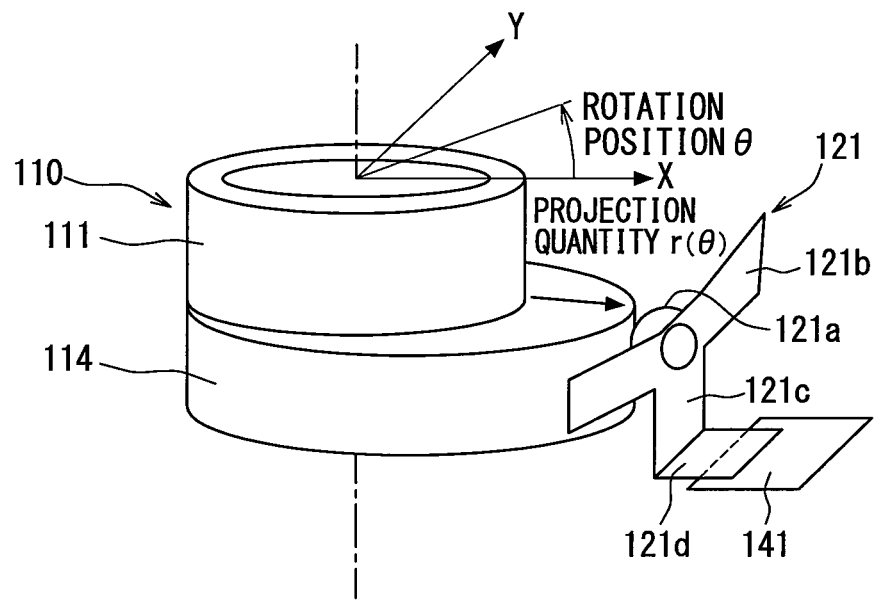
FIG. 10 is a perspective view showing an external appearance of the rotation operation section in the fourth embodiment.
Figure 11:
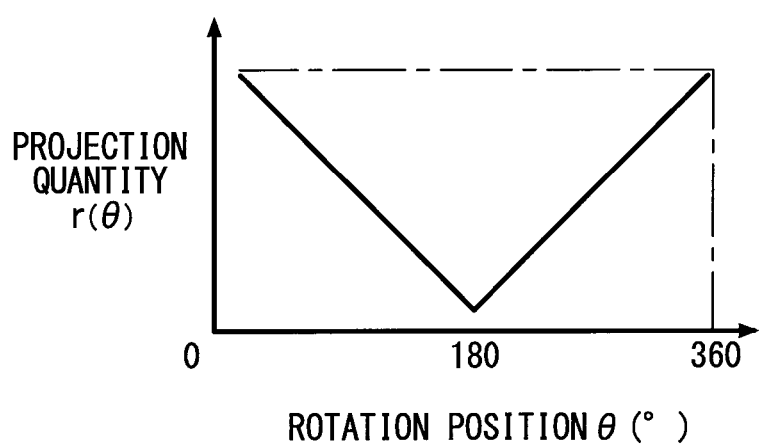
FIG. 11 is a graph showing a relation between a rotation position and a projection quantity in the fourth embodiment.

As shown in FIGS. 9 to 11, a projection quantity r(θ) of the recessed and projecting section 114 projecting from the peripheral surface 113B shifts from the maximum value to zero during half a circle of the peripheral surface 113B, and the projection quantity r(θ) shifts back to the maximum value in another half the circle. The recessed and projecting section 114 is formed like a cam eccentric to the body 111. It is to be noted that, on the end surface 113A of the flange section 113, the recessed section 190 for the plunger 200 which is continuously disposed at regular intervals is formed on a concentric circle with respect to the central position of the body 111.

The conductive section 120 is a member made of a conductive material, and has two conductive sections, namely, the first conductive section 121 and the second conductive section 122. As the conductive material, for example, a metal material such as phosphor bronze is used. Each of the conductive sections 121, 122 forms a similar structure.

That is, each of the conductive sections 121, 122, 123 has the protruding section 121a, the elastic section 121b, an extended section 121c, and a bent section 121d. The protruding section 121a is a region protruding toward the recessed and projecting section 114. A protruding tip of the protruding section 121a has a circular shape. The elastic section 121b is formed of a narrow plate member, and the protruding section 121a is connected to a longitudinal central section of the plate member. The elastic section 121b is disposed in such a direction as to be longitudinally intersecting with (here, orthogonal to) the axis of the rotation operation section 110. The elastic section 121b is a region that forms a so-called plate spring.

Further, the extended section 121c is a plate-shape region extending from the central section of the elastic section 121b toward the substrate 130 side. Moreover, the bent section 121d is a region bent in a plate form at the extended tip of the extended section 121c, so as to face the surface of the substrate 130.

At this time, the conductive sections 121, 122 are each disposed such that the tip of each protruding section 121a is directed to the recessed and projecting section 114. Further, the conductive sections 121, 122 are disposed such that the longitudinal direction of each elastic section 121b is directed to the tangential direction of the recessed and projecting section 114. Moreover, the first conductive section 121 and the second conductive section 122 are disposed at positions with different recess-and-projection phases in the recessed and projecting section 114. Here, the first conductive section 121 and the second conductive section 122 are disposed at positions 90 degrees separate from each other in the circumferential direction of the recessed and projecting section 114 (an X-directional position and a Y-directional position in FIG. 10). Then, both the longitudinal ends of each elastic section 121b are supported by a fixation member, not shown.

Then, the protruding sections 121a of the conductive sections 121, 122 are biased so as to come into contact with the recessed and projecting section 114 side by elasticity of the elastic sections 121b. Hence, when the rotation operation section 110 is rotationally operated, the protruding sections 121a move in the radial direction of the rotation operation section 110 along the recessed and projecting section 114. That is, in each protruding section 121a, a place with a small projection quantity $r(\theta)$ of the recessed and projecting section 114 moves to the axis side of the body 111, and a place with a large projection quantity $r(\theta)$ of the recessed and projecting section 114 moves to the opposite side to the axis of the body 111.

The electrode section 140 has two electrode sections, namely, the first electrode section 141 and the second electrode section 142. The electrode sections 141, 142 are mounted on the surface of the substrate 130 on the conductive section 120 side. Each of the electrode sections 141, 142 is a fixed electrode section that is fixed to the substrate 130. The first electrode section 141 is disposed so as to correspond to the position of the bent section 121d of the first conductive section 121. The second electrode section 142 is disposed so as to correspond to the position of the bent section 121d of the second conductive section 122. Positions of each bent section 121d and each electrode section 143 are set so as to form a predetermined space therebetween.

Each of the electrode sections 141, 142 forms a capacitor between itself and the opposite conductive section 120 (bent section 121d). When the protruding sections 121a and the bent sections 121d are moved by the recessed and projecting section 114, the electrode sections 141, 142 change respective capacitances Cx, Cy by changes in areas Sx, Sy in which the bent section 121d and each of the electrode sections 141, 142 overlap (hereinafter referred to as overlap areas Sx, Sy). A capacitance-type sensor is used here for the electrode section 140. The overlap area Sx is an area corresponding to the first electrode section 141, and the overlap area Sy is an area corresponding to the second electrode section 142.

Figure 12:
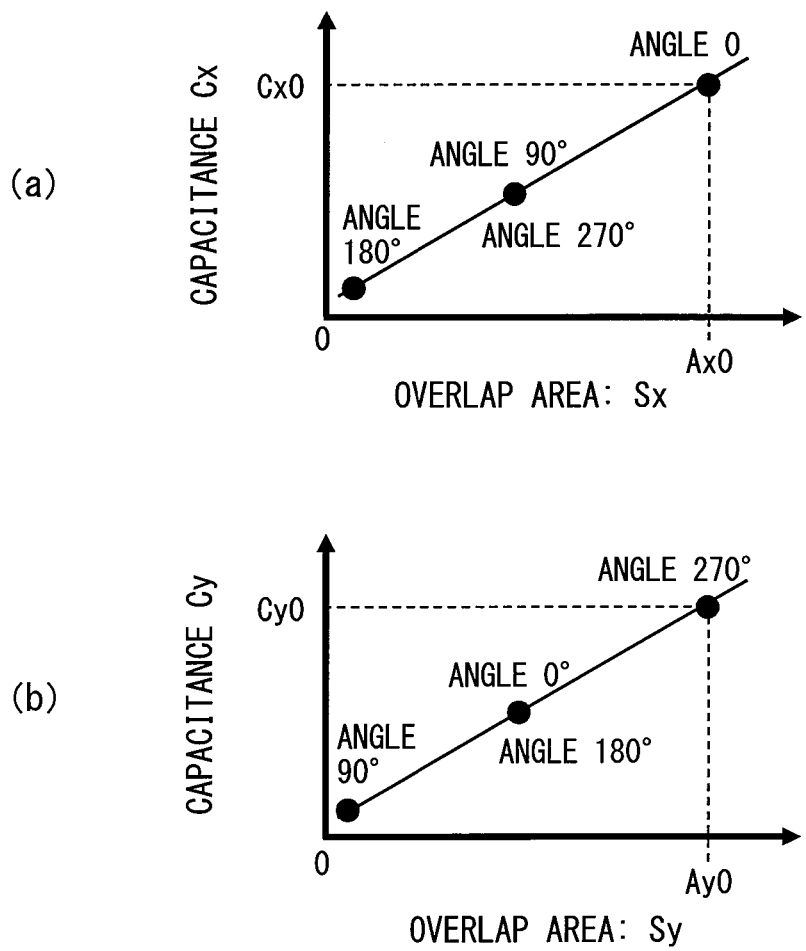
FIG. 12 is a graph each showing a relation between an overlap area of an electrode section and a conductive section and a capacitance in the fourth embodiment, where (a) in FIG. 12 shows an overlap area Sx and (b) in FIG. 12 shows an overlap area Sy.

As shown in FIG. 12, the capacitances Cx, Cy obtained by the respective electrode sections 141, 142 are proportional to the overlap areas Sx, Sy.

Here, on the substrate 130, a 0-degree position, a 90-degree position, a 180-degree position, and a 270-degree position clockwise are assumed as coordinate positions in the rotation direction of the rotation operation section 110. Further, the position of the electrode section 141 is taken as the 0-degree position, and the position of the electrode section 142 is taken as the 270-degree position. Moreover, in the circumferential direction of the recessed and projecting section 114, the position of the maximum projection quantity is taken as a reference point. The capacitance Cx in the electrode section 141 at the time of the reference point passing through each angle position by rotation operation of the rotation operation section 110 is as shown in (a) of FIG. 12, and the capacitance Cy in the electrode section 142 is as shown in (b) of FIG. 12. The capacitances Cx, Cy have linear relations with the respective overlap areas Sx, Sy. The electrode sections 141, 142 respectively output capacitance signals Cx, Cy to the detecting section 150.

The detecting section 150 detects a pattern of combination of changes in capacitances from the capacitance signals Cx, Cy outputted from the respective electrode sections 141, 142. The capacitance combination pattern is similar to that in the above third embodiment.

That is, from FIG. 12, when the capacitance Cx and the capacitance Cy are simultaneously observed, for example, different combinations of the capacitance values are obtained as follows: Cx is the maximum value and Cy is an intermediate value when the reference point is at the 0-degree position; Cx is the intermediate value and Cy is the minimum value when the reference point is at the 90-degree position; Cx is the minimum value and Cy is the intermediate value when the reference point is at the 180-degree position; and Cx is the intermediate value and Cy is the maximum value when the reference point is at the 270-degree position.

The detecting section 150 previously stores Expression 1 below. When the rotation operation section 110 is rotationally operated, the detecting section 150 grasps the combination pattern of both the capacitances Cx, Cy, to detect the rotation position θ based on the stored Expression 1, and can thus detect the position of the maximum protruding section (reference point) in the recessed and projecting section 114 on the rotational coordinates. Hence it is possible to detect the rotation direction and the rotation quantity of the rotation operation section 110 without providing the electrode section 140 on the rotation operation section 110 side.

Rotation position $\theta = \text{Tan}^{-1} \cdot \{(Cy - Cy0/2)/(Cx - Cx0/2)\}$ (Expression 1)

Fifth Embodiment

FIGS. 13 to 17 show a rotation operation device 100E of the fifth embodiment. The rotation operation device 100E of the fifth embodiment employs a recessed and projecting section 114d which changes its shape from the recessed and projecting section 114 of the rotation operation device 100C of the above third embodiment.

Figure 13:
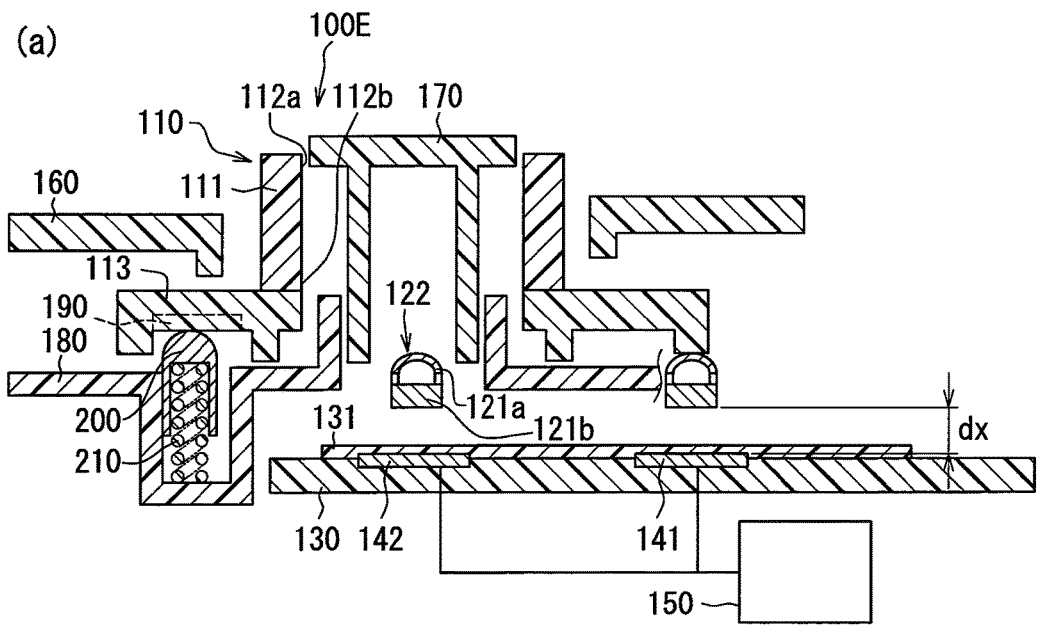
FIG. 13 shows a rotation operation device in a fifth embodiment, where (a) in FIG. 13 is a sectional view and (b) in FIG. 13 is a bottom view.
Figure 13:
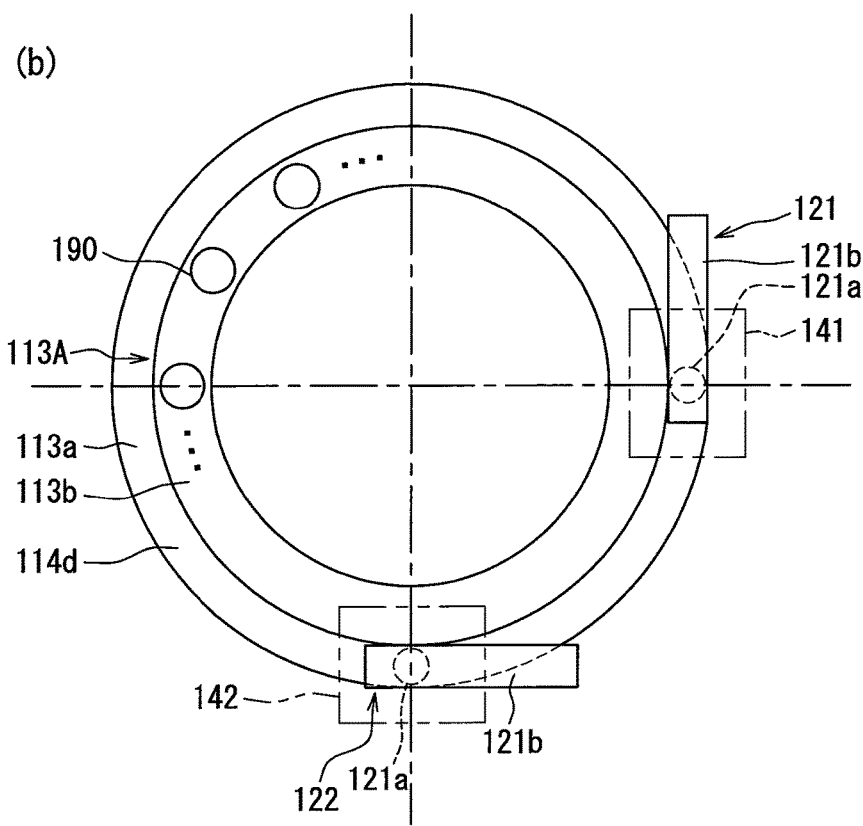
Figure 14:
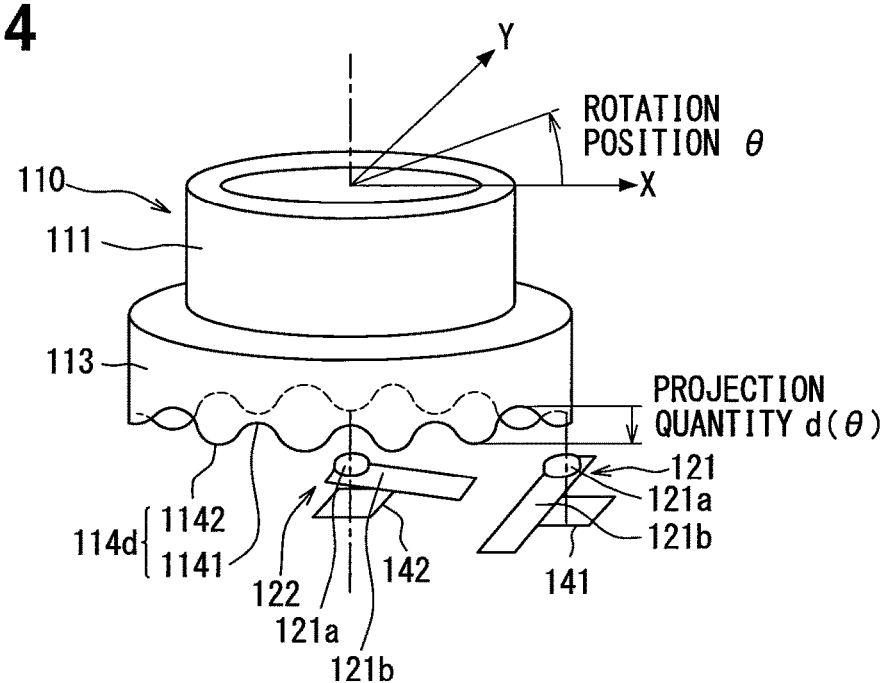
FIG. 14 is a perspective view showing an external appearance of the rotation operation section in the fifth embodiment.

As shown in FIGS. 13 and 14, the recessed and projecting section 114d is formed on the end surface 113A such that the recessed section 1141 and a projecting section 1142 form one (one period of) recess-and-projection, and this recess-and-projection continues. The recessed and projecting section 114d is formed as continuous waves.

The protruding section 121a of the first conductive section 121 and the protruding section 121a of the second conductive section 122 are disposed at positions with different recess-and-projection phases in the recessed and projecting section 114d. Specifically, when the position of the protruding section 121a of the first conductive section 121 is taken as a reference, the protruding section 121a of the second conductive section 122 is disposed at a position displaced by a quarter period with respect to one period of the recess-and-projection.

Figure 15:
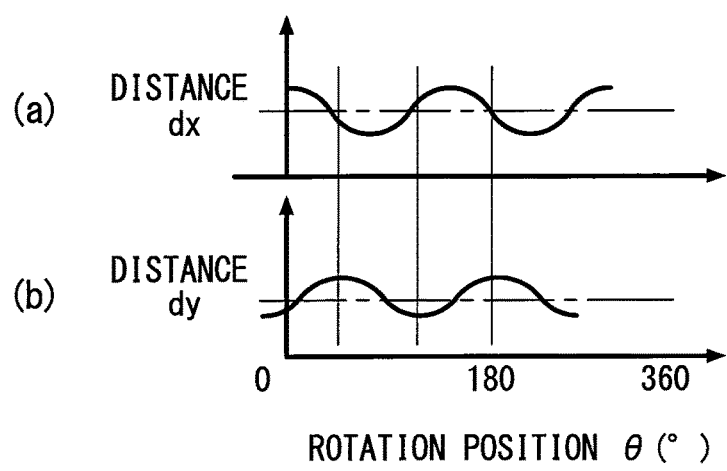
FIG. 15 is a graphs each showing a relation between a rotation position and a distance of an electrode section to a conductive section in the fifth embodiment, where (a) in FIG. 15 shows a distance dx and (b) in FIG. 15 shows a distance dy.

Accordingly, when the protruding section 121a of each conductive section 121 is moved by the recessed and projecting section 114d, the distance dx between the conductive section 121 and the electrode section 141 and the distance dy between the conductive section 122 and the electrode section 142 change as shown in FIG. 15. With the changes in the distances dx, dy, the capacitances Cx, Cy change in the respective electrode sections 141, 142.

Figure 16:
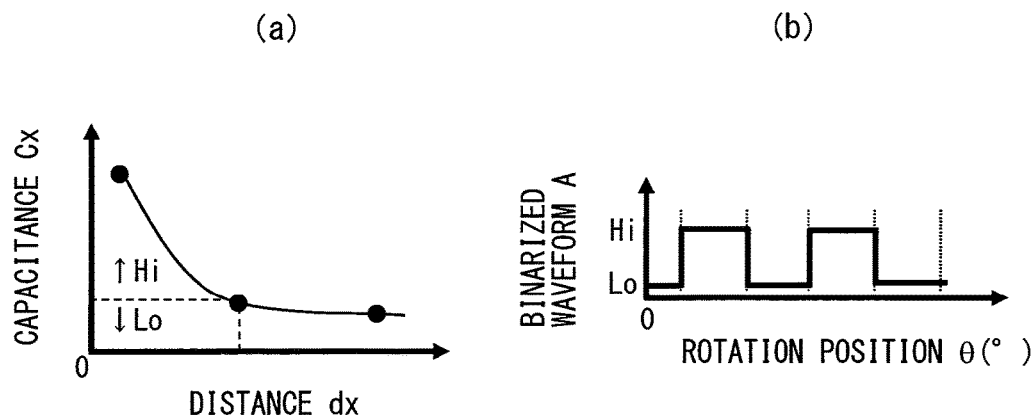
FIG. 16 is a graph in the fifth embodiment, where (a) in FIG. 16 is a graph showing a relation between the distance and a capacitance, and (b) in FIG. 16 is a graph showing a binarized waveform.
Figure 17:
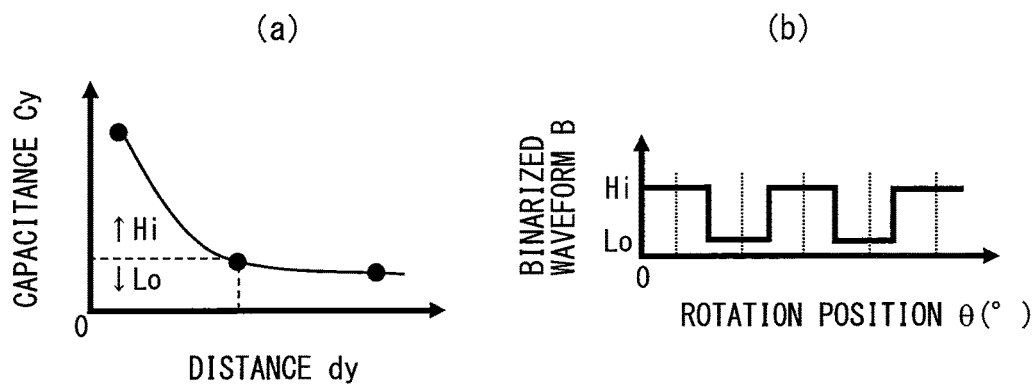
FIG. 17 is a graph in the fifth embodiment, where (a) in FIG. 17 is a graph showing a relation between the distance and the capacitance, and (b) in FIG. 17 is a graph showing a binarized waveform.

The detecting section 150 grasps signals of the capacitances Cx, Cy outputted from the respective electrode sections 141, 142 as signal waveforms A, B binarized to be either the Hi-signal or the Lo-signal based on a predetermined threshold, as shown in FIGS. 16 and 17.

The detecting section 150 then detects the rotation direction and the rotation quantity of the rotation operation section 110 as described below. A basic principle is the same as detection in the rotation direction in a general encoder. That is, the binarized signal waveforms A, B are displaced by a quarter period. Therefore, for example, at the time of the signal waveform A being Hi, when the signal waveform B changes from Lo to Hi, it is detected that the rotation operation section 110 is being rotationally operated clockwise. Further, the rotation quantity is calculated based on how many times Hi and Lo of the signal waveform A (or B) appear.

On the other hand, at the time of the signal waveform A being Lo, when the signal waveform B changes from Lo to Hi, it is detected that the rotation operation section 110 is being rotationally operated counterclockwise. Further, the rotation quantity is calculated based on how many times Hi and Lo of the signal waveform A (or B) appear.

Hence it is possible to obtain a similar effect to the above third embodiment.

Sixth Embodiment

FIGS. 18 to 22 show a rotation operation device 100F of the sixth embodiment. The rotation operation device 100F of the sixth embodiment is employs a recessed and projecting section 114e which changes its shape from the recessed and projecting section 114 of the rotation operation device 100D of the above fourth embodiment.

Figure 18:
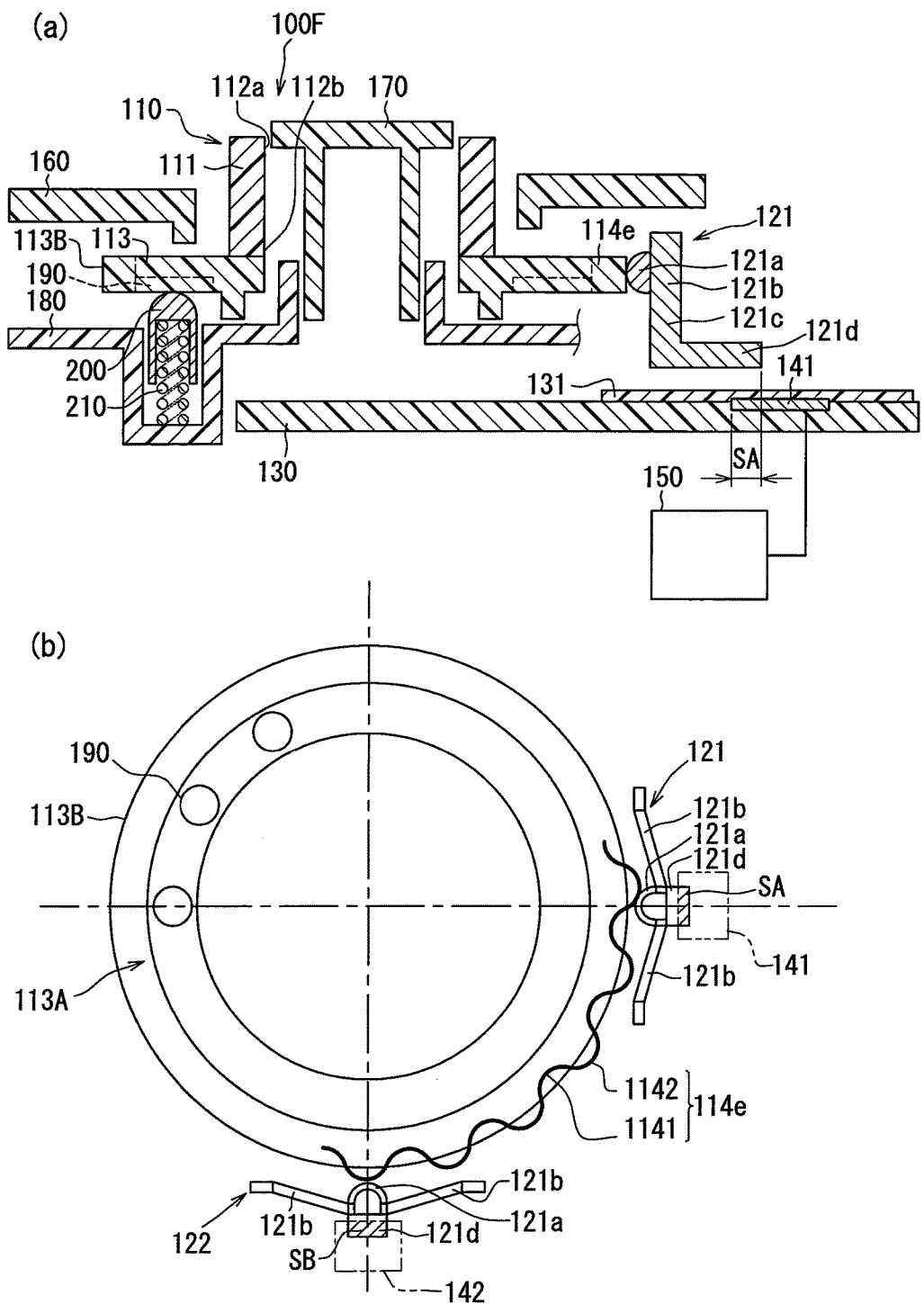
FIG. 18 shows a rotation operation device in a sixth embodiment, where (a) in FIG. 18 is a sectional view and (b) in FIG. 18 is a bottom view.
Figure 19:
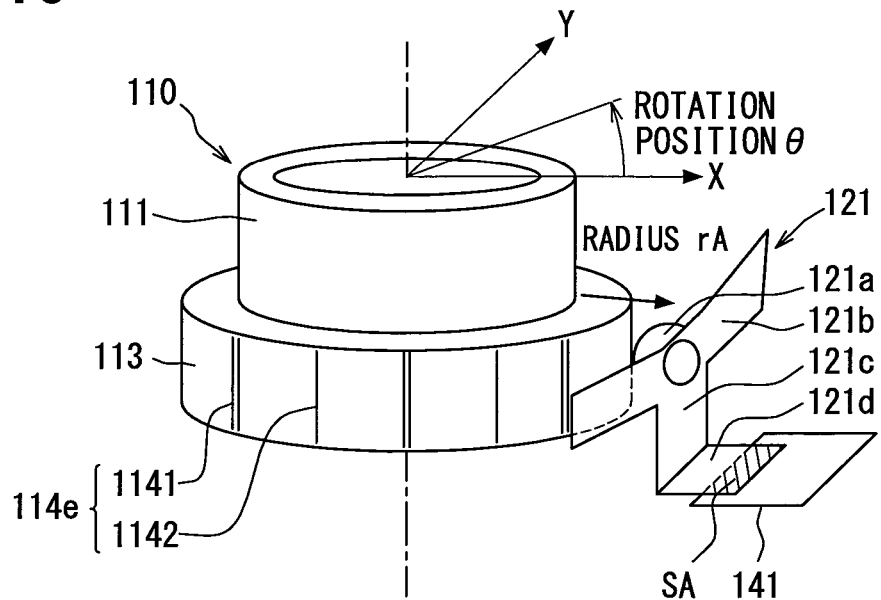
FIG. 19 is a perspective view showing an external appearance of the rotation operation section in the sixth embodiment.

As shown in FIGS. 18 and 19, the recessed and projecting section 114e is formed on the peripheral surface 113B such that the recessed section 1141 and a projecting section 1142 form one (one period of) recess-and-projection, and this recess-and-projection continues. The recessed and projecting section 114e is formed as continuous waves.

The protruding section 121a of the first conductive section 121 and the protruding section 121a of the second conductive section 122 are disposed at positions with different recess-and-projection phases in the recessed and projecting section 114e. Specifically, when the position of the protruding section 121a of the first conductive section 121 is taken as a reference, the protruding section 121a of the second conductive section 122 is disposed at a position displaced by a quarter period with respect to one period of the recess-and-projection.

Figure 20:
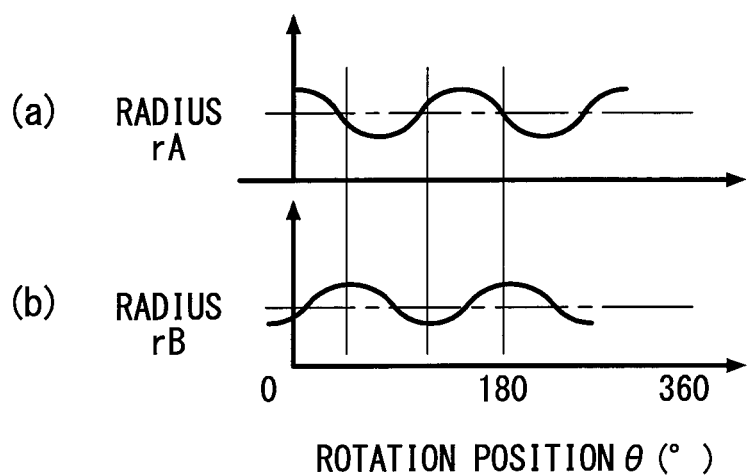
FIG. 20 is a graph each showing a relation between a rotation position and a radius in the sixth embodiment, where (a) in FIG. 20 shows a radius rA and (b) in FIG. 20 shows a radius rB.

Thus, when the rotation operation section 110 is rotationally operated, radiuses rA, rB of the flange section 113 change by the recessed and projecting section 114e as shown in FIG. 20. In FIG. 20, the radius rA is a radius of a region corresponding to the first conductive section 121, and a radius rB is a radius of a region corresponding to the second conductive section 122.

With the change in the radiuses rA, rB, the conductive sections 121, 122 are moved, and overlap areas SA, SB of the respective bent sections 121d to the electrode sections 141, 142 change. This leads to changes in capacitances CA, CB in the respective electrode sections 141, 142.

Figure 21:
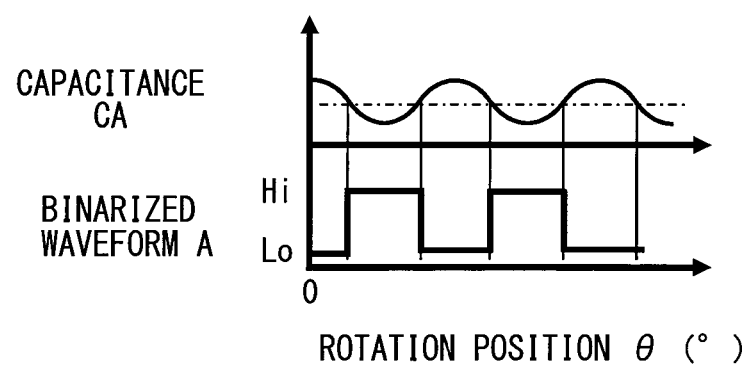
FIG. 21 is a graph showing a binarized waveform and a capacitance in the sixth embodiment.
Figure 22:
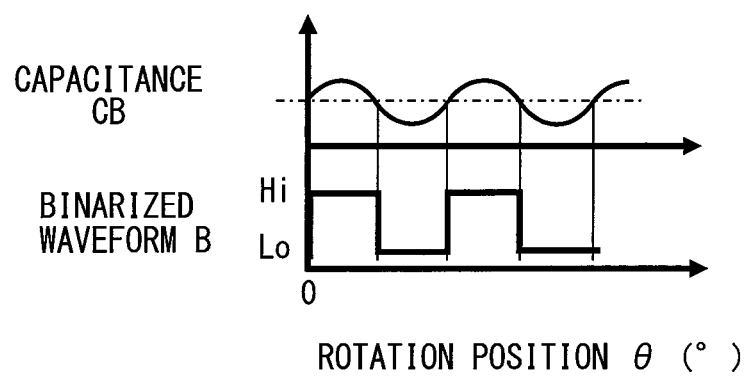
FIG. 22 is a graph showing a binarized waveform and a capacitance in the sixth embodiment.
Figure 23:
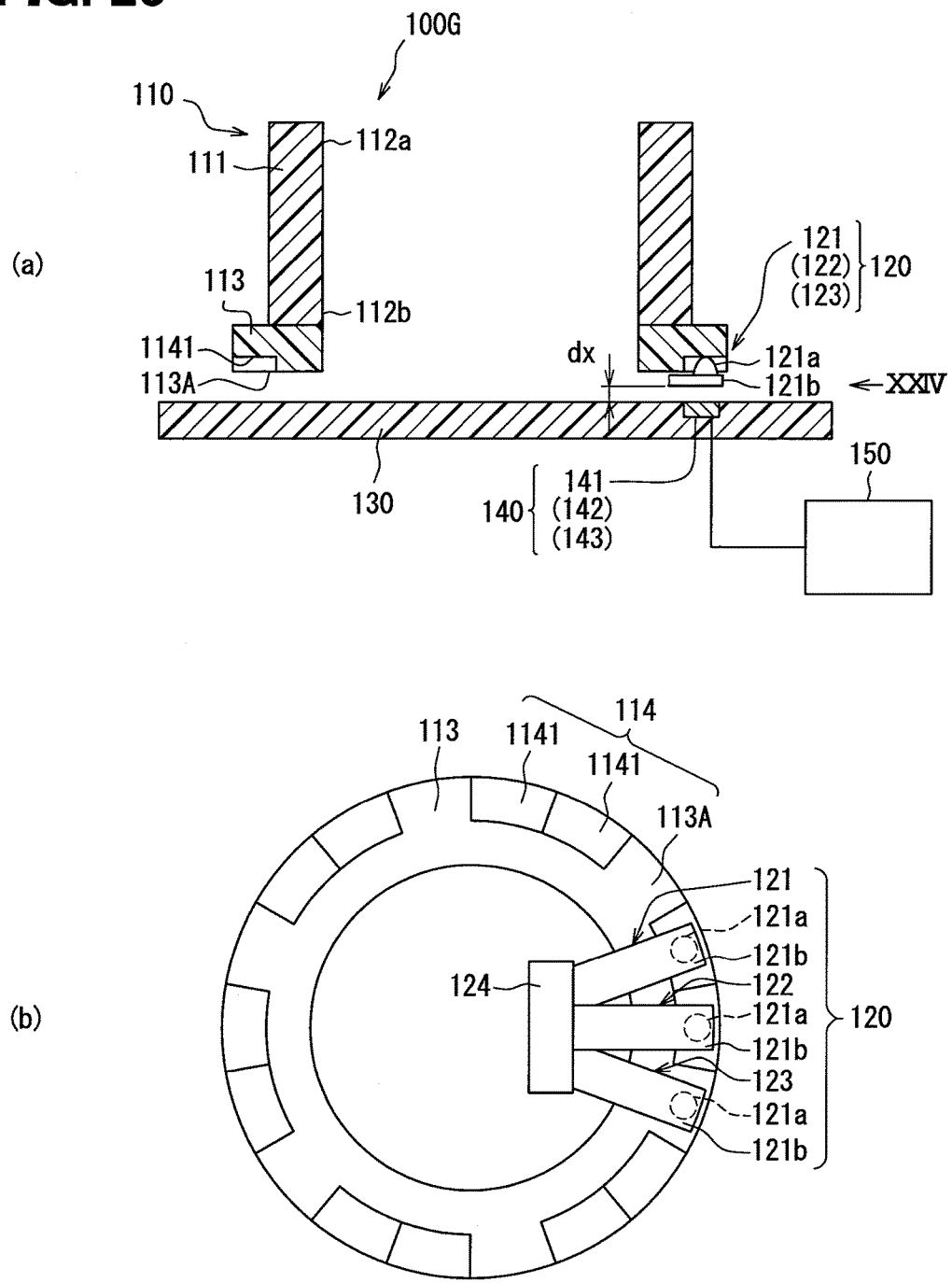
FIG. 23 shows a rotation operation device in a seventh embodiment, where (a) in FIG. 23 is a sectional view and (b) in FIG. 23 is a bottom view.

The detecting section 150 grasps signals of the capacitances CA, CB outputted from the respective electrode sections 141, 142 as signal waveforms A, B binarized to be either the Hi-signal or the Lo-signal based on a predetermined threshold, as shown in FIGS. 21, 22.

The detecting section 150 then detects the rotation direction and the rotation quantity of the rotation operation section 110 as described below. A basic principle is the same as detection in the rotation direction in a general encoder. That is, the binarized signal waveforms A, B are displaced by a quarter period. Therefore, for example at the time of the signal waveform A being Hi, when the signal waveform B changes from Lo to Hi, it is detected that the rotation operation section 110 is being rotationally operated clockwise. Further, the rotation quantity is calculated based on how many times Hi and Lo of the signal waveform A (or B) appear.

On the other hand, at the time of the signal waveform A being Lo, when the signal waveform B changes from Lo to Hi, it is detected that the rotation operation section 110 is being rotationally operated counterclockwise. Further, the rotation quantity is calculated based on how many times Hi and Lo of the signal waveform A (or B) appear.

Hence it is possible to obtain a similar effect to the above fourth embodiment.

Seventh Embodiment

FIGS. 23 to 27 show a rotation operation device 100G of the seventh embodiment. Compared to the rotation operation device 100A of the above first embodiment, the rotation operation device 100G of the seventh embodiment is formed by changing the arrangement of the recessed and projecting section 114, the conductive section 120, and the electrode section 140.

The recessed and projecting section 114 is formed on the outer periphery side of the end surface 113A of the flange section 113. The recessed and projecting section 114 is formed of the recessed section 1141 and the original flat surface (end surface 113A) not formed with this recessed section 1141. The end surface 113A not formed with the recessed section 1141 becomes the projecting section (113A) relatively with respect to the recessed section 1141. With combination of two recessed sections 1141 and one projecting section (113A) taken as one set of recessed and projecting section, the recessed and projecting section 114 is formed such that this one set of recessed and projecting section is repeatedly arrayed on the same periphery. In the present embodiment, as for the recessed and projecting section 114, for example, a total of six sets of recessed and projecting sections are provided by dividing 360 degrees for one circle by an interval of 20 degrees and disposing the recessed section 1141, the recessed section 1141, and the projecting section (113A) at each divided position so as to be arrayed in this order in the circumferential direction. Hence on the end surface 113A, during one circumferential circle, the recess-recess-projection appears six times at regular intervals.

In the above first embodiment, the recessed and projecting section 114 has the three recessed and projecting sections which are the first recessed and projecting section 114a, the second recessed and projecting section 114b, and the third recessed and projecting section 114c, whereas in the present embodiment, one recessed and projecting section 114 serves as each of the recessed and projecting sections 114a, 114b, 114c.

Figure 24:
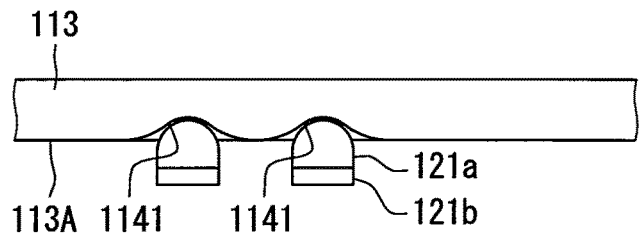
FIG. 24 is a view from an arrow direction of XXIV in FIG. 23.

It is to be noted that as shown in FIG. 24, the recessed section 1141 and the recessed section 1141 or the recessed section 1141 and the projecting section (113A) are connected by a smooth curved surface. Therefore, the protruding section 121a of the conductive section 120 is capable of smoothly moving with respect to the move of the recessed section 1141 and the projecting section (113A) when the rotation operation section 110 is rotationally operated.

The conductive section 120 is a member made of a conductive material, and has three conductive sections, namely, the first conductive section 121, the second conductive section 122, and the third conductive section 123. As the conductive material, for example, a metal material such as phosphor bronze is used. Each of the conductive sections 121, 122, 123 forms a similar structure.

That is, each of the conductive sections 121, 122, 123 is formed by providing the protruding section 121a on one longitudinal end side of the elastic section 121b that forms a narrow plate member. A protruding tip of the protruding section 121a has a circular shape. The elastic section 121b is a region that forms a so-called plate spring. At this time, the conductive sections 121, 122, 123 are each disposed such that the tip of each protruding section 121a is directed to the recessed and projecting section 114 side and arrayed in the circumferential direction of the recessed and projecting section 114. Out of the three protruding sections 121a, any two of them correspond to the positions of the recessed sections 1141 and the remaining one protruding section 121a corresponds to the position of the projecting section (113A).

Then, the other end side of each elastic section 121b is disposed so as to be directed to the center of the circular flange section 113. In other words, each elastic section 121b is radially disposed from the central side of the flange section 113 toward the radial outside thereof. Further, the other end side of each elastic sections 121b is fixed by the plate-shape fixed section 124. Each of the conductive sections 121, 122, 123 is integrated by the fixed section 124, to form the conductive section 120. Then, the fixed section 124 is supported by a fixation member, not shown.

Then, the protruding sections 121a of the conductive sections 121, 122, 123 are biased so as to come into contact with the recessed and projecting section 114 side by elasticity of the elastic sections 121b. Hence, when the rotation operation section 110 is rotationally operated, the protruding sections 121a move in the axial direction of the rotation operation section 110 along the recessed and projecting section 114. That is, when each protruding section 121a moves to the body 111 side in the recessed section 1141 of the recessed and projecting section 114, and on the other hand, each protruding section 121a moves to the opposite side to the body 111 in the projecting section (113A).

It should be noted that in the present embodiment, since each protruding section 121a is disposed at the same radial position on the end surface 113A. Accordingly, the length of each elastic section 121b is equivalent, and differently from the above first embodiment, the spring constant in each elastic section 121b is the same. The electrode section 140 has three electrode sections, namely, the first electrode section 141, the second electrode section 142, and the third electrode section 143. The electrode sections 141, 142, 143 are mounted on the surface of the substrate 130 on the conductive section 120 side. Each of the electrode sections 141, 142, 143 is a fixed electrode section that is fixed to the substrate 130. The first electrode section 141 is disposed so as to correspond to the position of the protruding section 121a of the first conductive section 121. The second electrode section 142 is disposed so as to correspond to the position of the protruding section 121a of the second conductive section 122. The third electrode section 143 is disposed so as to correspond to the position of the protruding section 121a of the third conductive section 123.

Similarly to the above first embodiment, each of the electrode sections 141, 142, 143 forms a capacitor between itself and the opposite conductive section 120 (protruding section 121a), and changes a capacitance in accordance with a distance dx therebetween, which changes when the protruding section 121a is moved by the recessed and projecting section 114.

The first conductive section 121 and the first electrode section 141 constitute one set (combination) with respect to the recessed and projecting section 114. Similarly, the second conductive section 122 and the second electrode section 142 constitute a second set with respect to the recessed and projecting section 114. Similarly, the third conductive section 123 and the third electrode section 143 constitute a third set with respect to the recessed and projecting section 114.

The protruding sections 121a of the conductive sections 121 to 123 and the electrode sections 141 to 143 in the three sets are disposed on the same periphery as the recessed and projecting sections 114, and further they are disposed adjacently to one another.

In the present embodiment, when the crew rotates the rotation operation section 110 to either direction so as to change the preset temperature of the air conditioner, the recessed section 1141 and the projecting section (113A) in the recessed and projecting section 114 move in the circumferential direction. Accordingly, the protruding section 121a of each of the conductive sections 121, 122, 123 gets into the recessed section 1141, or comes into contact with the protruding section (113A). The behavior of the protruding section 121a of each of the conductive sections 121, 122, 123 getting into the recessed section 1141 is as follows. The protruding sections 121a in any two sets out of the three sets get into two recessed sections 1141, and the protruding section 121a in the remaining one set comes into contact with the projecting section (113A). When the rotation is further continued in the same direction, the protruding section 121a in one set out of the protruding sections 121a in any two sets then come into contact with the projecting section (113A) and the protruding section 121a in the remaining one set newly gets into the recessed section 1141, and this is continuously performed. The same also applies to the inverse rotation direction.

That is, the timings at which the protruding sections 121*a* of the conductive sections 121, 122, 123 get into the recessed sections 1141 or come into contact with the projecting sections (113A) are different timings. Further, the rotation quantity from the time of contact of the protruding section 121*a* in one set with the projecting section (113A) to the time of contact the protruding section 121*a* in the adjacent set with the projecting section (113A) is equal to the interval between the projecting section (113A) and the recessed section 1141 in the circumferential direction. The interval is 20 degrees here as described above.

Figure 25:
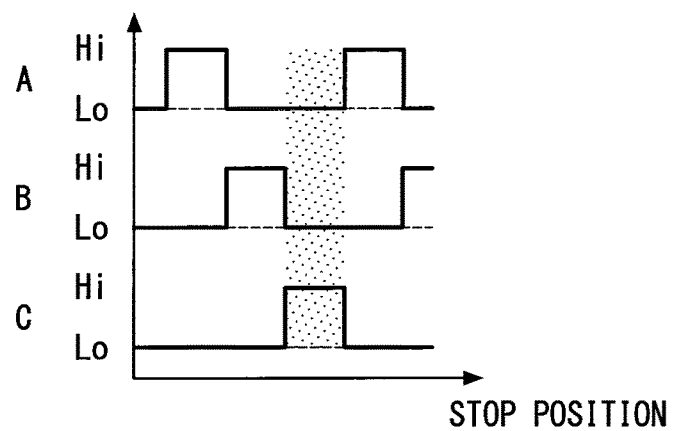
FIG. 25 is a graph showing a signal waveform in an electrode section in the seventh embodiment.

In accordance with this behavior of the protruding section 121*a*, the distances dx between the conductive sections 121, 122, 123 and the respective electrode sections 141, 142, 143 change, and the detecting section 150 obtains signal waveforms A, B, C shown in FIG. 25.

Figure 26:
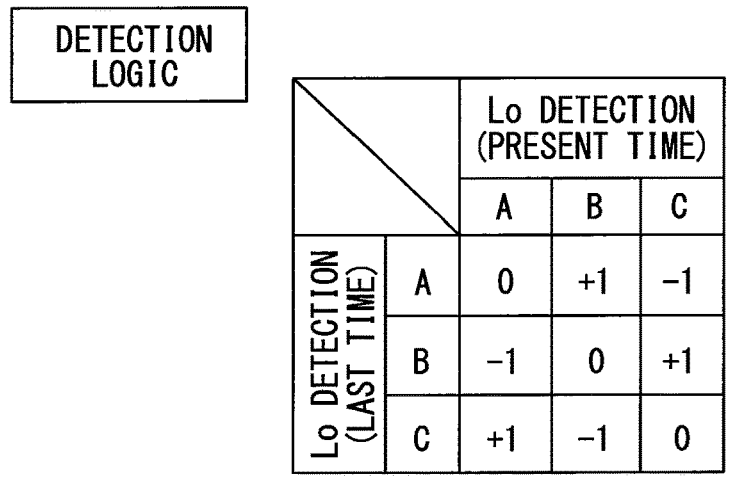
FIG. 26 is a table showing a logic for detecting a rotation direction in the seventh embodiment.

Then, using the combination pattern of changes in signal waveforms A, B, C, the detecting section 150 detects the direction and quantity of the operated rotation of the rotation operation section 110 based on a detection logic shown in FIG. 26. The detection logic is as follows as compared to that of the above first embodiment. That is, in the signal waveforms A, B, C last time and the signal waveforms A, B, C this time during the rotation operation, when the Lo-signal changes from A to B, B to C or C to A, determination of +1 is made, to determine that the rotation direction is clockwise. On the other hand, in the signal waveforms A, B, C last time and the signal waveforms A, B, C this time, when the Lo-signal changes from C to B, B to A or A to C, determination of −1 is made, to determine that the rotation direction is counterclockwise.

When the rotation operation by the crew is continued in the same direction, the detecting section 150 repeats the above determination and counts the number of times +1 is obtained or the number of times −1 is obtained, to calculate a quantity of clockwise or counterclockwise rotation. The rotation quantity is calculated by: Number of +1 (or −1)× Interval (20 degrees) between projecting section (113A) and recessed section 1141. As thus described, similarly to the above first embodiment, the detecting section 150 detects the signal waveforms A, B, C described in FIG. 25 based on the capacitance signals, and the detecting section 150 detects the direction and quantity of the operated rotation of the rotation operation section 110 on the basis of the detection logic on the basis of FIG. 26, by use of the combination pattern of changes in signal waveforms A, B, C. Hence it is possible in the present embodiment to obtain a similar effect to the above first embodiment. That is, it is possible to detect the rotation direction and the rotation quantity of the rotation operation section 110 without providing the electrode section 140 on the rotation operation section 110 side. Further, it is possible to obtain the click feeling at the time of rotation operation by the recessed and projecting section 114, the protruding section 121*a*, and the elastic section 121*b*.

In the present embodiment, the recessed and projecting sections 114 are formed on the periphery of the end surface 113A, and further, the protruding sections 121*a* in the conductive sections 120 and the electrode sections 141, 142, 143 in the electrode sections 140 in the respective sets are disposed adjacently on the same periphery as the recessed and projecting sections 114. Hence as compared to the above first embodiment, at the time of installing the recessed and projecting sections 114, the conductive sections 120, and the electrode sections 140, it is possible to prevent an increase in installation area toward the radial outside of the flange section 113 of the rotation operation section 110. This enables space-saving of a radially outside region of the rotation operation device 100G, thus allowing enhancement of flexibility in terms of arrangement of other switches adjacent to the rotation operation device 100G, characters, marks and the like. That is, it is possible to reduce restriction on design.

Figure 27:
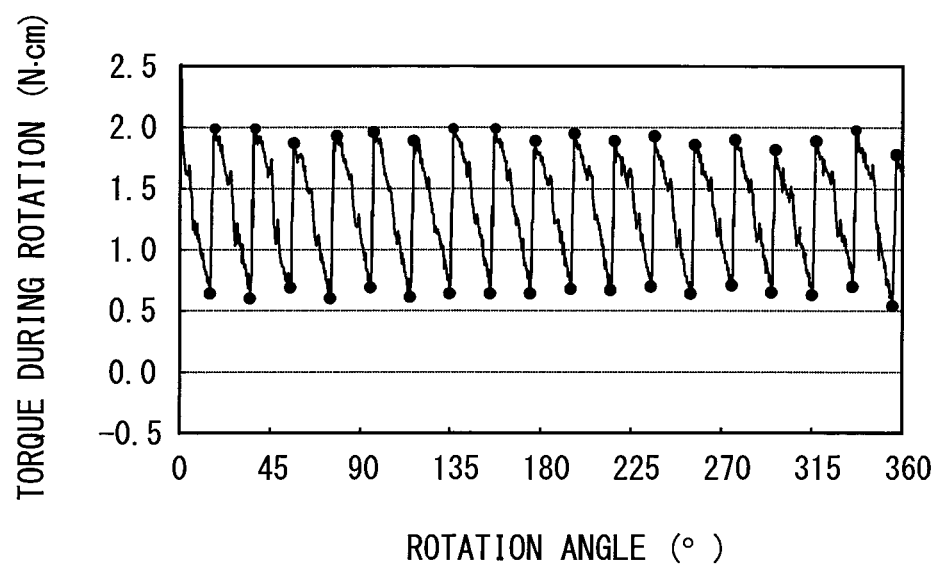
FIG. 27 is a graph showing torque at the time of rotation with respect to a rotation angle in the seventh embodiment.

It is to be noted that in the present embodiment, especially due to adjacent arrangement of the protruding sections 121*a* in the conductive section 120 on the same periphery as the recessed and projecting sections 114, there has been a concern that the biased force to the flange section 113 is deflected in the circumferential direction and a change is generated in torque at the time of rotation of the rotation operation section 110. However, as shown in FIG. 27, the torque at the time of rotation with respect to the rotation angle of the rotation operation section 110 shifts in an almost uniform variation range (between 0.5 and 2.0 N·cm) during rotation of one turn, and occurrence of no deflection has been confirmed.

Eighth Embodiment

Figure 28:
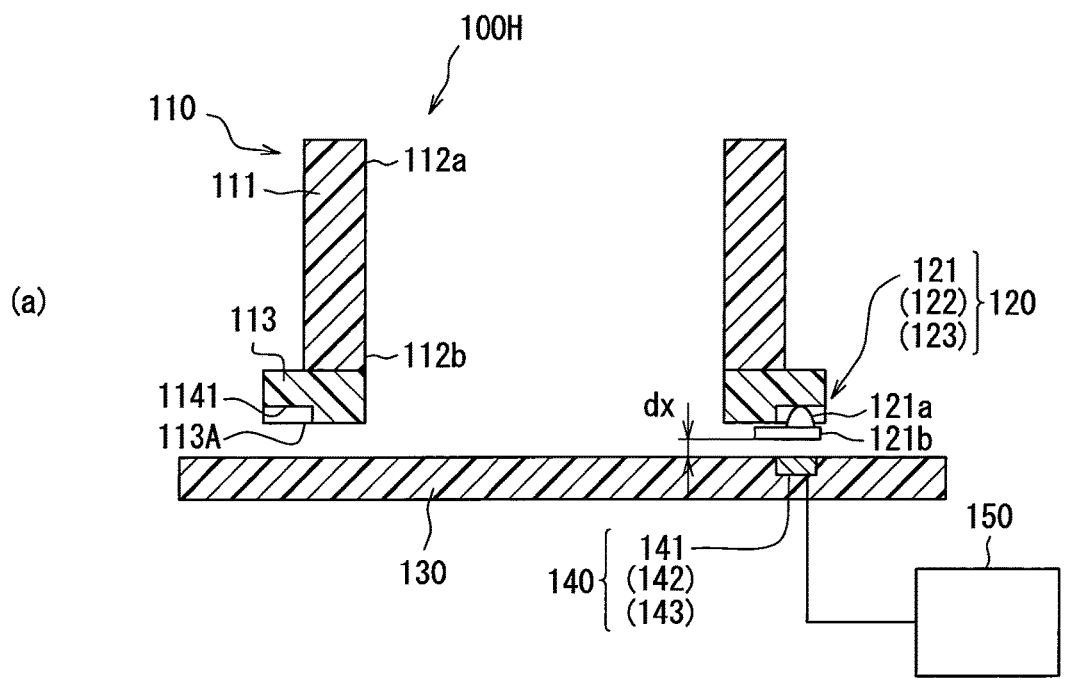
FIG. 28 shows a rotation operation device in an eighth embodiment, where (a) in FIG. 28 is a sectional view and (b) in FIG. 28 is a bottom view.
Figure 28:
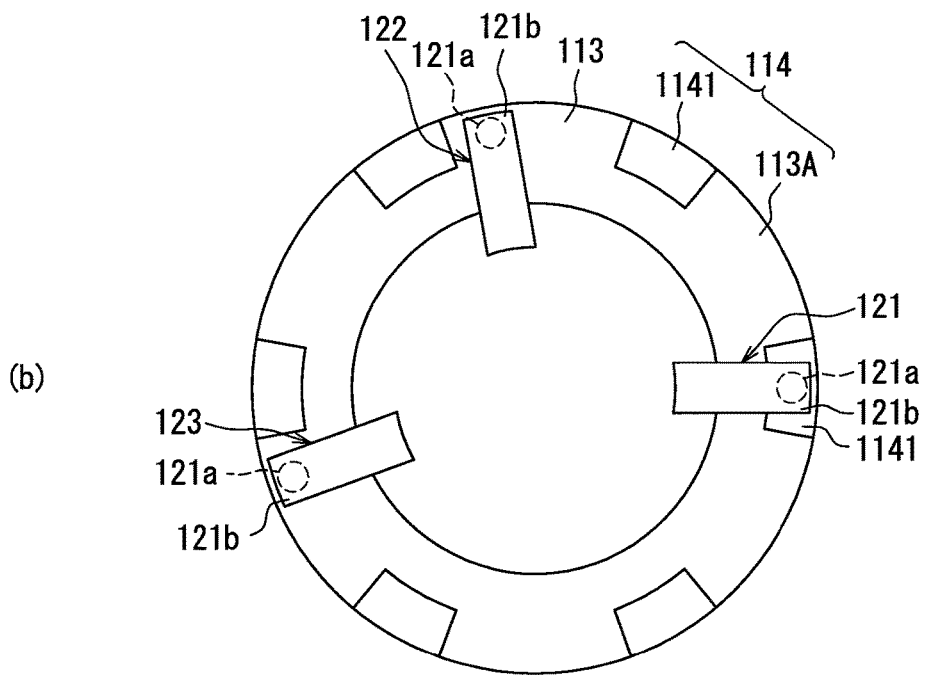
Figure 29:
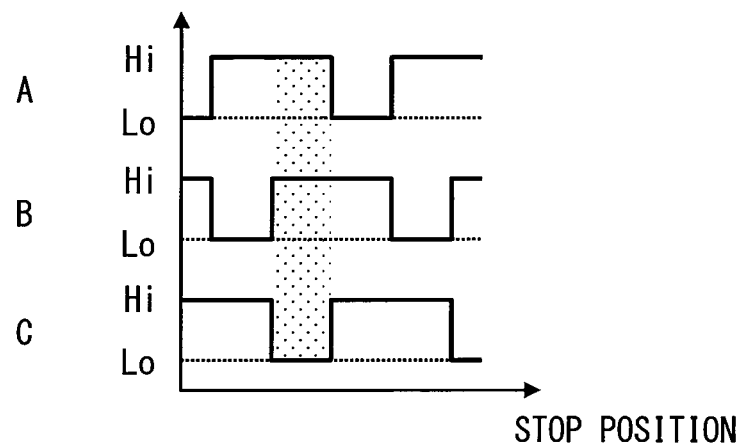
FIG. 29 is a graph showing a signal waveform in an electrode section in the eighth embodiment.
Figure 30:
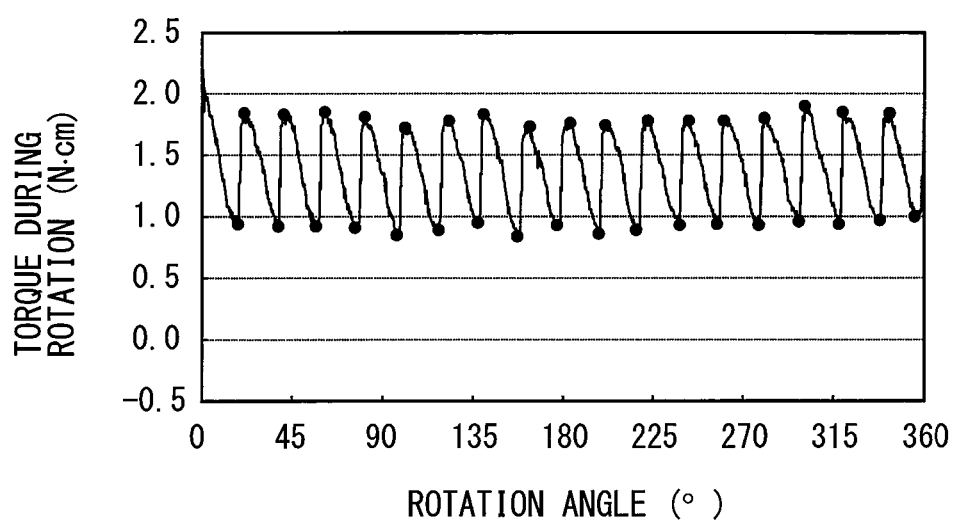
FIG. 30 is a graph showing torque at the time of rotation with respect to a rotation angle in the eighth embodiment.

FIGS. 28 to 30 show a rotation operation device 100H of an eighth embodiment. Compared to the rotation operation device 100G of the above seventh embodiment, the rotation operation device 100H of the eighth embodiment is formed by changing the recess-and-projection shape of the recessed and projecting section 114, and changing arrangement of the conductive section 120 and the electrode section 140.

The recessed and projecting section 114 is formed on the outer periphery side of the end surface 113A of the flange section 113. The recessed and projecting section 114 is formed of the recessed section 1141 and the original flat surface (end surface 113A) not formed with this recessed section 1141. The end surface 113A not formed with the recessed section 1141 becomes the projecting section (113A) relatively with respect to the recessed section 1141. With combination of one recessed section 1141 and two projecting sections (113A) taken as one set of recessed and projecting section, the recessed and projecting section 114 is formed such that this one set of recessed and projecting section is repeatedly arrayed on the same periphery. In the present embodiment, as for the recessed and projecting section 114, for example, a total of six sets of recessed and projecting sections are provided by dividing 360 degrees of one circle at an interval of 20 degrees and disposing the projecting section (113A), the projecting section (113A), and the recessed section 1141 at each divided position so as to be arrayed in this order in the circumferential direction. Hence on the end surface 113A, during one circumferential circle, the recess-projection-projection appears six times at regular intervals.

The conductive section 120 has a similar structure to that of the above seventh embodiment, but the arrangements of the conductive sections 121, 122, 123 with respect to the recessed and projecting sections 114 are different. That is, the protruding sections 121*a* of the conductive sections 121, 122, 123 are disposed so as to be dispersed on the periphery of the recessed and projecting section 114. Hence in the present embodiment, the fixed section 124 described in the above seventh embodiment is not used, and the other end side of each elastic section 121*b* is supported by a fixation member, not shown.

Each of the conductive sections 121, 122, 123 is disposed as follows, for example. That is, as shown in FIG. 28, the first conductive section 121 and the second conductive section 122 are separated from each other by 100 degrees in the circumferential direction. Further, the second conductive section 122 and the third conductive section 123 are separated from each other by 100 degrees in the circumferential direction. Further, the third conductive section 123 and the first conductive section 121 are separated from each other by 160 degrees in the circumferential direction.

At this time, at a predetermined rotation position of the rotation operation section 110, the position relation among the three protruding sections 121a is that any two protruding sections 121a come into contact with the projecting section (113A) and the remaining one protruding section 121a gets into the recessed section 1141.

The electrode section 140 has a similar structure to that of the above seventh embodiment, but arrangement with respect to the recessed and projecting section 114 is different. That is, the first electrode section 141 is disposed so as to correspond to the position of the protruding section 121a of the first conductive section 121. The second electrode section 142 is disposed so as to correspond to the position of the protruding section 121a of the second conductive section 122. The third electrode section 143 is disposed so as to correspond to the position of the protruding section 121a of the third conductive section 123. Hence the electrode sections 141, 142, 143 are disposed so as to be dispersed on the periphery of the recessed and projecting section 114, along with the protruding sections 121a.

As described above, three sets of the protruding sections 121a of the conductive sections 121 to 123 and the electrode sections 141 to 143 are disposed on the same periphery as the recessed and projecting sections 114, and further they are disposed so as to be dispersed.

In the present embodiment, when the crew rotates the rotation operation section 110 to either direction so as to change the preset temperature of the air conditioner, the recessed section 1141 and the projecting section (113A) in the recessed and projecting section 114 move in the circumferential direction. Accordingly, the protruding section 121a of each of the conductive sections 121, 122, 123 gets into the recessed section 1141, or comes into contact with the protruding section (113A).

The behavior of the protruding section 121a of each of the conductive sections 121, 122, 123 getting into the recessed section 1141 is similar to the case of the above first embodiment. That is, when the protruding section 121a in one set gets into the recessed section 1141 and the rotation is further continued in the same direction, the protruding section 121a in the adjacent set then gets into the recessed section 1141, which is continuously performed. The same also applies to the inverse rotation direction. That is, the timings at which the protruding sections 121a of the conductive sections 121, 122, 123 get into the recessed sections 1141 are different timings. Further, a quantity of rotation from the time of entry of the protruding section 121a in one set into the recessed section 1141 to the time of entry of the protruding section 121a in the adjacent set into the recessed section 1141 in the adjacent set is equal to the interval between the recessed sections 1141 in the circumferential direction. The interval is 20 degrees here as in the above seventh embodiment.

In accordance with this behavior of the protruding section 121a, the respective distances dx between the conductive sections 121, 122, 123 and the electrode sections 141, 142, 143 change, and the detecting section 150 obtains signal waveforms A, B, C shown in FIG. 29 as in the above first embodiment.

Then, using a combination pattern of changes in signal waveforms A, B, C, the detecting section 150 detects the direction and quantity of the operated rotation of the rotation operation section 110 based on the detection logic (FIG. 3) described in the above first embodiment. Hence it is possible in the present embodiment to obtain a similar effect to the above first embodiment. That is, it is possible to detect the rotation direction and the rotation quantity of the rotation operation section 110 without providing the electrode section 140 on the rotation operation section 110 side. Further, it is possible to obtain the click feeling at the time of rotation operation by the recessed and projecting section 114, the protruding section 121a, and the elastic section 121b.

In the present embodiment, the recessed and projecting sections 114 are formed on the periphery of the end surface 113A, and further, the protruding sections 121a in the conductive sections 120 and the electrode sections 141, 142, 143 in the electrode sections 140 in the sets are disposed on the same periphery as the recessed and projecting sections 114. Similarly to the above seventh embodiment, this embodiment enables space-saving of a radially outside region in the rotation operation device 100H, thus allowing enhancement of flexibility in terms of arrangement of other switches adjacent to the rotation operation device 100H, characters, marks and the like. That is, it is possible to reduce restraints on designing.

Further, the protruding sections 121a in the conductive sections 120 and the electrode sections 141, 142, 143 in the electrode sections 140 in the sets are disposed so as to be dispersed on the same periphery as the recessed and projecting sections 114. This makes the biased force to the flange section 113 uniform in the circumferential direction, and it is thus possible to reduce the inclination of the rotation operation section 110 and the change in torque at the time of rotation of the rotation operation section 110. As shown in FIG. 30, in the present embodiment, the torque at the time of rotation with respect to the rotation angle of the rotation operation section 110 shifts in an almost uniform variation range, and the variation range (between 1.0 and 2.0 N·cm) can be made small as compared to that in the above seventh embodiment.

Other Embodiments

In the above first embodiment, the three conductive sections 121, 122, 123 are fixed by the fixed section 124. However, the fixed section 124 may be deleted.

Further, in the above first, second, seventh, and eighth embodiments, the description was given assuming that the three sets of the recessed and projecting section 114, the conductive section 120, and the electrode section 140 are provided. However, this is not restrictive, and four or more sets may be provided.

Further, in the first and second embodiments, the recessed and projecting section 114 is formed by the groove section or the depressed section. However, this is not restrictive, and it may be formed by smoothly connecting a recessed section and a projecting section and making this recess-and-projection continuous. This leads to smooth move of the protruding section 121a in the conductive section 120, thus allowing improvement in the feeling at the time of rotation operation.

Further, in the first and second embodiment, the elastic section 121b is supported by both longitudinal end sides. However, this is not restrictive, and it may be supported by only one side as in the third and fifth embodiments. Moreover, the elastic section 121b is a plate spring in each of the above embodiment. However, this is not restrictive, and a coil spring or the like may be used.

Further, in the above first, second, fifth, and sixth embodiments, the capacitances Cx, Cy are binarized with respect to the predetermined threshold. However, hysteresis properties may be provided to the predetermined threshold, to prevent chattering.

Further, in each of the above embodiments, at the time of grasping the capacitance, the detecting section 150 reads the capacitance a plurality of times and takes data as formal detection data when the plurality of capacitances agree, thereby allowing prevention of noise.

Further, by increasing a capacitance detection speed, the detecting section 150 can ensure the followability when the crew performs quick rotation operation.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A rotation operation device comprising:
   a rotation operation section having a cylindrical shape and rotationally operable by an operator around an axis of the cylindrical shape;
   a plurality of recessed and projecting sections arranged on an axial end surface or a peripheral surface of the rotation operation section and having recesses and projections in a circumferential direction of the rotation operation section;
   a conductive section made of a conductive material, having a protruding section protruding toward each of the recessed and projecting sections and an elastic section that biases the protruding section by elasticity to each of the recessed and projecting sections, and movable in a recess-and-projection direction by each of the recessed and projecting sections when the rotation operation section rotates;
   an electrode section disposed so as to face the conductive section and changing a capacitance in accordance with a movement of the conductive section; and
   a detecting section detecting the change in the capacitance, wherein:
   three or more sets of combination of the recessed and projecting sections, the conductive section, and the electrode section are provided;
   the conductive section in each set is moved in turn by a respective recessed and projecting section in the recess-and-projection direction at a different timing with regular intervals; and
   the detecting section detects a rotation direction and a rotation quantity of the rotation operation section by means of a combination pattern of the change in the capacitance provided by the electrode section,
   wherein the recessed and projecting sections, the conductive section, and the electrode section in each set of the combination are arranged in a concentric manner.

2. The rotation operation device according to claim 1, wherein:
   the recessed and projecting sections, the protruding section, and the elastic section have a moderation feeling generating function for generating a moderation feeling for the operator when the rotation operation section rotates.

3. The rotation operation device according to claim 1, wherein:
   the recessed and projecting sections are arranged on the end surface;
   the elastic section in each of the three or more sets is arranged in line along a radial direction of the end surface; and
   a biasing force of the elasticity of the elastic section in each set is set to be larger as the elastic section is located closer to a radial inside of the rotation operation section.

4. The rotation operation device according to claim 1, wherein:
   the conductive section in each of the three or more sets is integrated.

5. The rotation operation device according to claim 1, wherein:
   the protruding section contacts each of the recessed and projecting sections.

6. The rotation operation device according to claim 1, wherein:
   a protruding direction of the protruding section is a direction from the electrode section toward the recessed and projecting sections.

7. The rotation operation device according to claim 1, wherein:
   the electrode section includes a plurality of electrodes arranged concentrically from each other.

8. The rotation operation device according to claim 1, wherein:
   the conductive section includes a plurality of conductive sections arranged concentrically from each other.

9. The rotation operation device according to claim 1, wherein:
   the recessed and projecting sections include a plurality of recessed and projecting sections arranged concentrically from each other.

10. The rotation operation device according to claim 1, wherein:
    the plurality of electrodes corresponds respectively to a position of the protruding section of the conductive section.

* * * * *